US011042140B2

United States Patent
Coumou et al.

(10) Patent No.: US 11,042,140 B2
(45) Date of Patent: Jun. 22, 2021

(54) ADAPTIVE CONTROL FOR A POWER GENERATOR

(71) Applicant: MKS Instruments, Inc., Andover, MA (US)

(72) Inventors: David J. Coumou, Webster, NY (US); Yuriy Elner, Pittsford, NY (US); Aung Toe, Rochester, NY (US); Daniel M. Gill, Macedon, NY (US); Eldridge M. Mount, IV, Macedon, NY (US); Shaun Smith, Melrose, MA (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 16/297,799

(22) Filed: Mar. 11, 2019

(65) Prior Publication Data

US 2019/0391547 A1    Dec. 26, 2019

Related U.S. Application Data

(60) Provisional application No. 62/690,202, filed on Jun. 26, 2018.

(51) Int. Cl.
    *G05B 19/042* (2006.01)
    *H01L 21/67* (2006.01)
    *H01J 37/32* (2006.01)

(52) U.S. Cl.
    CPC ...... *G05B 19/042* (2013.01); *H01J 37/32926* (2013.01); *H01L 21/67069* (2013.01);
    (Continued)

(58) Field of Classification Search
    CPC .......... G05B 19/042; G05B 2219/2639; G05B 13/04; H01L 21/67069; H01J 37/32926; H01J 37/321; H01J 37/32091
    See application file for complete search history.

(56) References Cited

U.S. PATENT DOCUMENTS

| 6,707,255 B2 | 3/2004 | Coumou et al. |
| 7,602,127 B2 | 10/2009 | Coumou |

(Continued)

FOREIGN PATENT DOCUMENTS

| CN | 102714498 A | 10/2012 |
| KR | 10-2017-0110039 A | 10/2017 |

(Continued)

OTHER PUBLICATIONS

International Search Report for International Patent App. No. PCT/US2019/038730 dated Oct. 8, 2019.

(Continued)

*Primary Examiner* — Ziaul Karim
(74) *Attorney, Agent, or Firm* — Harness, Dickey & Pierce, P.L.C.

(57) ABSTRACT

A power supply control system includes a power generator for providing a signal to a load. The power generator includes a power controller controlling a power amplifier. The power generator includes an adaptive controller for varying the output signal controlling the power amplifier. The adaptive controller compares an error between a measured output and a predicted output to determine adaptive values applied to the power controller. The power generator also includes a sensor that generates an output signal that is digitized and processed. The sensor signal is mixed with a constant K. The constant K is varied to vary the processing of the sensor output signal. The value K may be commutated based on the phase, frequency, or both phase and frequency, and the bandwidth of K is determined by coupled power in the sensor output signal.

27 Claims, 16 Drawing Sheets

(52) U.S. Cl.
CPC ..... *G05B 2219/2639* (2013.01); *H01J 37/321* (2013.01); *H01J 37/32091* (2013.01)

(56) References Cited

U.S. PATENT DOCUMENTS

| | | | |
|---|---|---|---|
| 8,110,991 | B2 | 2/2012 | Coumou |
| 8,395,322 | B2 | 3/2013 | Coumou |
| 8,576,013 | B2 | 11/2013 | Coumou |
| 8,781,415 | B1 | 7/2014 | Coumou et al. |
| 10,304,669 | B1 | 5/2019 | Coumou et al. |
| 2007/0024362 | A1* | 2/2007 | Radomski ............... H03F 1/52 330/123 |
| 2007/0249304 | A1* | 10/2007 | Snelgrove ............... H03F 3/191 455/127.2 |
| 2014/0055034 | A1 | 2/2014 | Coumou |
| 2014/0263199 | A1 | 9/2014 | Nelson et al. |
| 2014/0306742 | A1* | 10/2014 | Menzer ............... H03K 5/01 327/184 |
| 2016/0163514 | A1 | 6/2016 | Fisk, II et al. |
| 2017/0062186 | A1 | 3/2017 | Coumou et al. |
| 2017/0345620 | A1* | 11/2017 | Coumou ............ H01J 37/32183 |
| 2019/0108976 | A1 | 4/2019 | Van Zyl |

FOREIGN PATENT DOCUMENTS

| | | |
|---|---|---|
| TW | 201644177 A | 12/2016 |
| TW | 201944729 A | 11/2019 |

OTHER PUBLICATIONS

International Preliminary Report on Patentability for PCT Patent App. No. PCT/US2019/038730, dated Dec. 29, 2020.
English translation of Taiwanese Office Action for corresponding TW Patent Application No. 108121605, dated Apr. 20, 2021.

* cited by examiner

ADAPTIVE CONTROL FOR A POWER GENERATOR

CROSS-REFERENCE TO RELATED APPLICATIONS

This application claims the benefit of U.S. Provisional Application No. 62/690,202, filed on Jun. 26, 2018. The entire disclosure of the application referenced above is incorporated herein by reference.

FIELD

The present disclosure relates to power generation and to controlling power generation in systems driving non-linear loads.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Plasma etching is frequently used in semiconductor fabrication. In plasma etching, ions are accelerated by an electric field to etch exposed surfaces on a substrate. In one basic implementation, the electric field is generated based on Radio Frequency (RF) or Direct Current (DC) power signals generated by a respective RF or DC generator of a power delivery system. The power signals generated by the generator must be precisely controlled to effectively execute plasma etching.

SUMMARY

A power generator comprises a power amplifier. The power amplifier generates a power signal communicated to a non-linear load in accordance with an input control signal. A power controller communicates the input control signal to the power amplifier. An adaptive controller generates at least one adjustment value communicated to the power controller to adjust responsiveness of the power controller. The at least one adjustment value includes one of a feedback and a feedforward component.

A power generator comprises an adaptive controller and a power amplifier. The adaptive controller generates a control signal based on an input setpoint for the power generator to generate a power signal, a measured representation of the power signal, and a modeled representation of the power signal. The control signal includes a feedback component and a feedforward component. The power amplifier generates the power signal communicated to a non-linear load in accordance with the control signal.

An adaptive controller comprises a feedforward circuit, a feedback circuit, and a combiner. The feedforward circuit generates a feedforward signal based on an input setpoint for a power generator to generate a power signal and based on a difference between a measured representation of the power signal and a modeled representation of the power signal. The feedback circuit generating a feedback signal based on the difference between the measured representation of the power signal and the modeled representation of the power signal. The combiner generates a control signal by combining the feedforward signal and the feedback signal. The control signal enables the power generator to generate the power signal communicated to a non-linear load.

An adaptive rate controller comprises a direct digital synthesizer, a first mixer, a second mixer, and a subsystem controller. The direct digital synthesizer generates a sinusoidal signal and a cosine signal based on a control signal. The first mixer mixes the sinusoidal signal and a digital representation of a power signal generated by a power generator and generating a real component of the digital representation of the power signal. The second mixer mixes the cosine signal and the digital representation of the power signal and generating an imaginary component of the digital representation of the power signal. The subsystem controller generating the control signal based on the real and imaginary components, an input setpoint for the power generator to generate the power signal, and a parameter used to control the power signal.

A power generator comprises a power amplifier, a power controller, and an adaptive controller. The power amplifier generates a power signal communicated to a non-linear load in accordance with an input control signal. The power controller communicates the input control signal to the power amplifier. The adaptive controller generates at least one adjustment value communicated to the power controller to adjust responsiveness of the power controller. The at least one adjustment value includes one of a feedback component and a feedforward component.

A method comprises generating a control signal based on an input setpoint for a power generator to generate a power signal, a measured representation of the power signal, and a modeled representation of the power signal. The control signal includes a feedback component and a feedforward component. The method further comprises generating the power signal communicated to a non-linear load in accordance with the control signal. The method further comprises generating the feedforward component based on the input setpoint and a difference between the measured representation of the power signal and the modeled representation of the power signal. The method further comprises generating the feedback component based the difference between the measured representation of the power signal and the modeled representation of the power signal. The method further comprises generating an output to adaptively scale the measured representation of the power signal based on at least one of the input setpoint, the measured representation of the power signal, and the control signal. The method further comprises generating the control signal based on the adaptively scaled measured representation of the power signal. The method further comprises generating an output to adaptively scale the measured representation of the power signal based on commutating by at least one of phase, frequency, or both phase and frequency.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Figure 1:
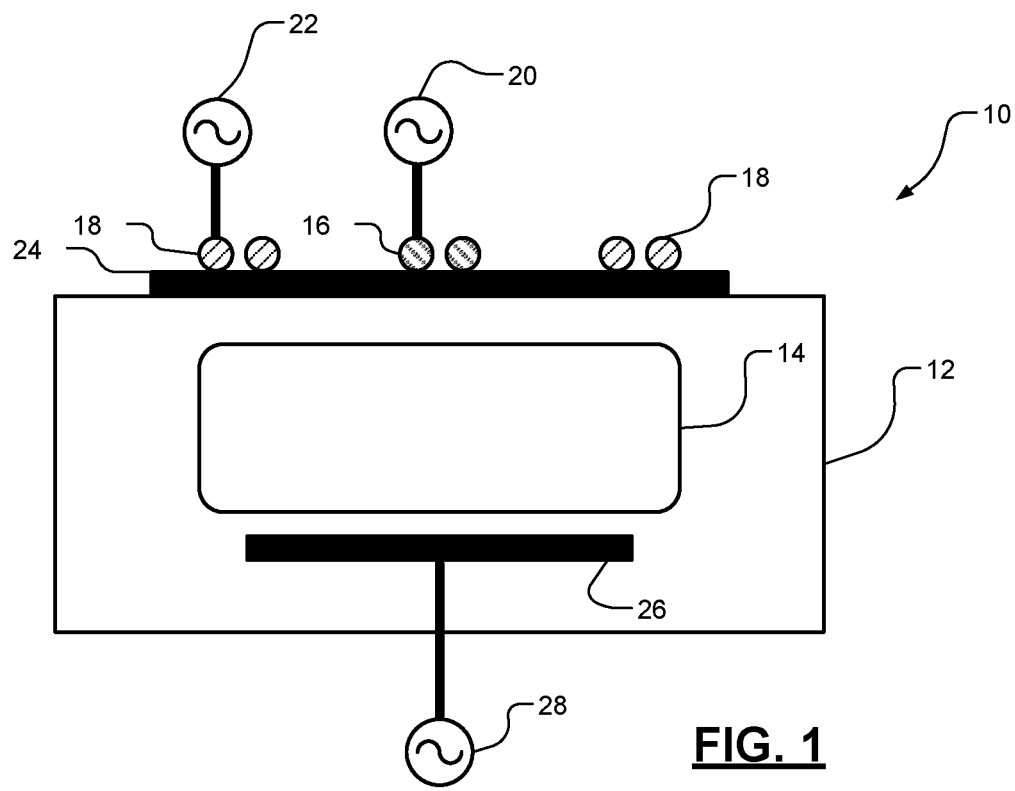
FIG. 1 depicts a representation of an inductively coupled plasma system.

Throughout the specification, power generator may refer to a DC power generator or a RF power generator.

A power system may include a DC or RF power generator, a matching network, and a load (e.g., a plasma chamber). The power generator generates a DC or RF power signal, which is received by the matching network or impedance optimizing controller or circuit. The matching network or impedance optimizing controller or circuit matches an input impedance of the matching network to a characteristic impedance of a transmission line between the power generator and the matching network. This impedance matching aids in maximizing an amount of power forwarded to the matching network ("forward power") and minimizing an amount of power reflected back from the matching network to the power generator ("reverse power"). Forward power may be maximized and reverse power may be minimized when the input impedance of the matching network matches the characteristic impedance of the transmission line.

In the power source or power supply field, there are typically two approaches to applying a power signal to the load. A first, more traditional approach is to apply a continuous power signal to the load. In a continuous mode, a continuous power signal is typically a constant DC or RF sinusoidal power signal that is output continuously by the power source to the load. In the continuous mode approach, the power signal assumes a constant DC or sinusoidal output, and the amplitude of the power signal and/or frequency (of a RF power signal) can be varied in order to vary the output power applied to the load.

A second approach to applying the power signal to the load involves pulsing the power signal, rather than applying a continuous power signal to the load. In a pulse mode of operation, a power signal is modulated by a modulation signal in order to define an envelope for the modulated power signal. In a conventional pulse modulation scheme, the power signal typically remains at a constant amplitude and, for RF signals, a constant frequency. Power delivered to the load is varied by varying the modulation signal, rather than varying the power signal.

In a typical power supply configuration, output power applied to the load is determined by using sensors that measure the forward and reflected power or the voltage and current of the RF signal applied to the load. Either set of these signals is analyzed in a control loop. The analysis typically determines a power value which is used to adjust the output of the power supply in order to vary the power applied to the load. In a power delivery system where the load is a plasma chamber or other non-linear load, the varying impedance of the load causes a corresponding varying of power applied to the load, as applied power is in part a function of the impedance of the load.

In plasma systems, power is typically delivered in one of two configurations. In a first configuration, the power is capacitively coupled to the plasma chamber. Such systems are referred to as capacitively coupled plasma (CCP) systems. In a second configuration, the power is inductively coupled to the plasma chamber. Such systems are typically referred to as inductively coupled plasma (ICP) systems. Plasma delivery systems typically include a bias power and a source power applied to one or a plurality of electrodes. The source power typically generates the plasma and controls plasma density, and the bias power modulates ions in the formulation of a sheath of plasma. The bias and the source may share the same electrode or may use separate electrodes, in accordance with various design considerations.

When a power delivery system drives a non-linear load, such as a plasma chamber, the power absorbed by the plasma sheath results in a density of ions with a range of ion energy. One characteristic measure of ion energy is the ion energy distribution function (IEDF). The ion energy distribution function (IEDF) can be controlled with the bias power. One way of controlling the IEDF for a system in which multiple RF power signals are applied to the load occurs by varying multiple RF signals that are related by frequency and phase. The frequencies between the multiple RF power signals may be locked, and the relative phase between the multiple RF signals may also be locked. Examples of such systems can be found with reference to U.S. Pat. Nos. 7,602,127, 8,110, 991, and 8,395,322, all assigned to the assignee of the present invention and incorporated by reference in this application.

Plasma processing systems may also include components for plasma generation and control. One such component is a non-linear load, such as a plasma chamber or reactor. A typical plasma chamber or reactor utilized in plasma processing systems, such as by way of example, for thin-film manufacturing, can utilize a dual frequency system. One power generator (the source) controls the generation of the plasma, and the power generator (the bias) controls ion energy. Examples of dual power systems include systems that are described in U.S. Pat. Nos. 7,602,127; 8,110,991; and 8,395,322, referenced above. The dual power system described in the above-referenced patents requires a closed-loop control system to adapt power supply operation for the purpose of controlling ion density and its corresponding ion energy distribution function (IEDF).

Multiple approaches exist for controlling a plasma chamber for generating plasmas. For example, in RF power delivery systems, phase and frequency of the driving RF signals may be used to control plasma generation. For RF driven plasma sources, the periodic waveform affecting plasma sheath dynamics and the corresponding ion energy are generally known and are controlled by the frequency of the periodic waveforms and the associated phase interaction. Another approach in RF power delivery systems involves dual frequency control. That is, two RF frequency sources are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath voltage for a desired IEDF must be formulated for a wide-process space to support material surface interaction. In one responsive approach in an inductively coupled plasma system, controlling power applied to a source electrode controls the plasma density while controlling power applied to the bias electrode modulates ions to control the IEDF to provide etch rate control. By using source electrode and bias electrode control, the etch rate is controlled via the ion density and energy.

As integrated device fabrication continues to evolve, so do the power requirements for controlling the plasma for device fabric fabrication. For example, for memory device fabrication, the requirements for bias power continue to increase. Increased power generates higher energetic ions for faster surface interaction, thereby increasing the etch rate. Increased bias power is sometimes accompanied by, in RF systems, a lower bias frequency requirement along with an increase in the number of bias power sources coupled to the plasma sheath created in the plasma chamber. The increased power at a lower bias frequency and the increased number of bias power sources results in intermodulation distortion (IMD) emissions from a sheath modulation. The IMD emissions can significantly reduce power delivered by the source where plasma generation occurs. U.S. patent application Ser. No. 13/834,786, filed Mar. 15, 2013 and entitled Pulse Synchronization by Monitoring Power in Another Frequency Band, assigned to the assignee of the present application and incorporated by reference herein, describes a method of pulse synchronization by monitoring power in another frequency band. In the referenced U.S. patent application, the pulsing of a second RF generator is controlled in accordance with detecting at the second RF generator the pulsing of a first RF generator, thereby synchronizing pulsing between the two RF generators.

FIG. 1 depicts an exemplary representation of an inductively coupled plasma (ICP) system 10. ICP system 10 includes a non-linear load, such as a plasma chamber 12, which will be referred to interchangeably herein, for generating plasma 14. Power in the form of voltage or current is applied to plasma chamber 12 via a pair of coils, including a coil assembly that in various embodiments includes an inner coil 16 and an outer coil 18. Power is applied to inner coil 16 via a RF power generator or power source 20, and power is applied to outer coil 18 via RF power generator or power source 22. Coils 16 and 18 are mounted to dielectric window 24 that assists in coupling power to plasma chamber 12. A substrate 26 is placed in plasma chamber 12 and typically forms the work piece that is the subject of plasma operations. A RF power generator, power supply or power source 28 (the terms may be used herein interchangeably) applies power to plasma chamber 12 via substrate 26. In various configurations, the power sources 20, 22 provide a source voltage or current to ignite or generate plasma 14 or control the plasma density. Also in various configurations, power source 28 provides a bias voltage or current that modulates the ions to control the ion energy or ion density of the plasma 14. In various embodiments, power sources 20, 22 are locked to operate at the same frequency, voltage, and current, with fixed or varying relative phases. In various other embodiments, power sources 20, 22 may operate at different frequencies, voltages, and currents, and relative phases.

Figure 2:
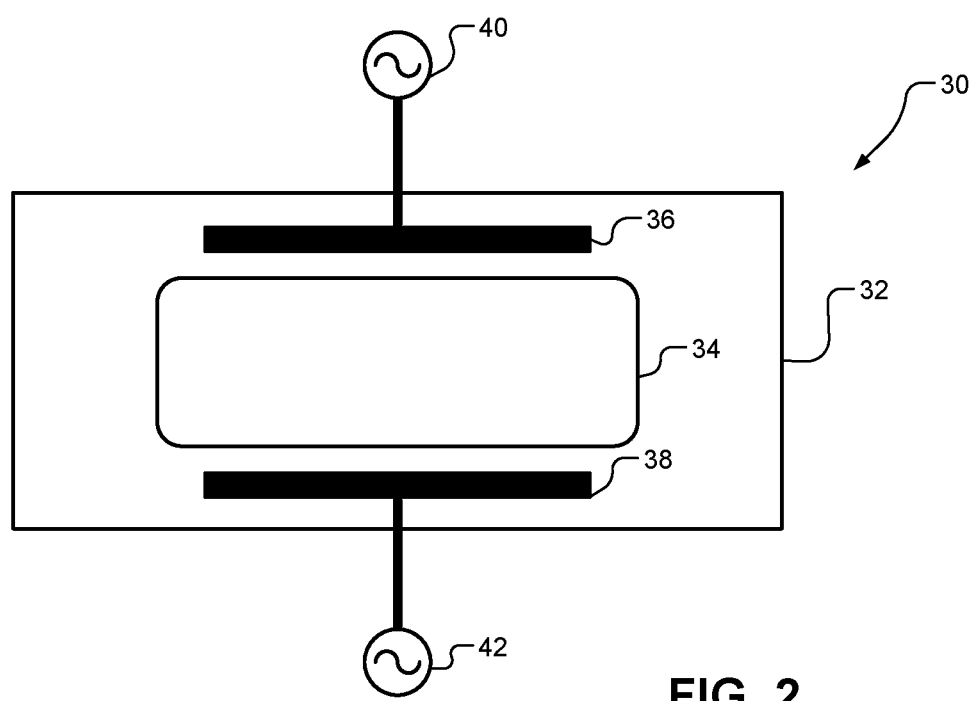
FIG. 2 depicts a representation of a capacitively coupled plasma system.

FIG. 2 depicts an exemplary representation of a capacitively coupled plasma (CCP) system 30. CCP system 30 includes a plasma chamber 32 for generating plasma 34. A pair of electrodes 36, 38 placed within plasma chamber 32 connect to respective DC ($\omega$=0) or RF power generators or power sources 40, 42. In various embodiments, power source 40 provides a source voltage or current to ignite or generate plasma 34 or control the plasma density. Also in various embodiments, power source 42 provides a bias voltage or current that modulates the ions in the plasma to control the ion energy and/or ion density of the plasma 34. In various RF embodiments, power sources 40, 42 operate at relative phases when the sources are harmonically related. In various other embodiments, power sources 40, 42 operate at different frequencies, voltages, and currents, with fixed or varying relative phases. Also in various embodiments, power sources 40, 42 can be connected to the same electrode, while the counter electrode is connected to ground or to yet a third DC ($\omega$=0) or RF power generator.

Figure 3:
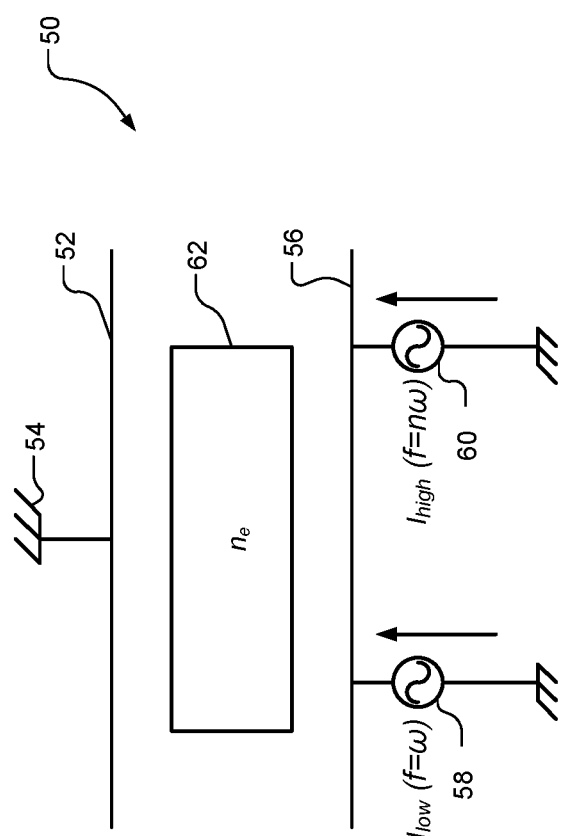
FIG. 3 depicts a generalized representation of a plasma system arranged according to various embodiments of the present disclosure.

FIG. 3 depicts a generalized representation of a dual power input plasma system 50. Plasma system 50 includes a first electrode 52 connected to a ground 54 and a second electrode 56 spaced apart from first electrode 52. A first DC ($\omega$=0) or RF power source 58 generates a first RF power applied to second electrode 56 at a first frequency f. A second power source 60 generates a second DC ($\omega$=0) or RF power applied to second electrode 56. In various embodiments, power source 60 operates at a second frequency n$\omega$ that is the $n^{th}$ harmonic frequency of the frequency of first power source 58. In various other embodiments, power source 60 operates at a frequency that is not a multiple of the frequency of the first power source 58.

Figure 4A:
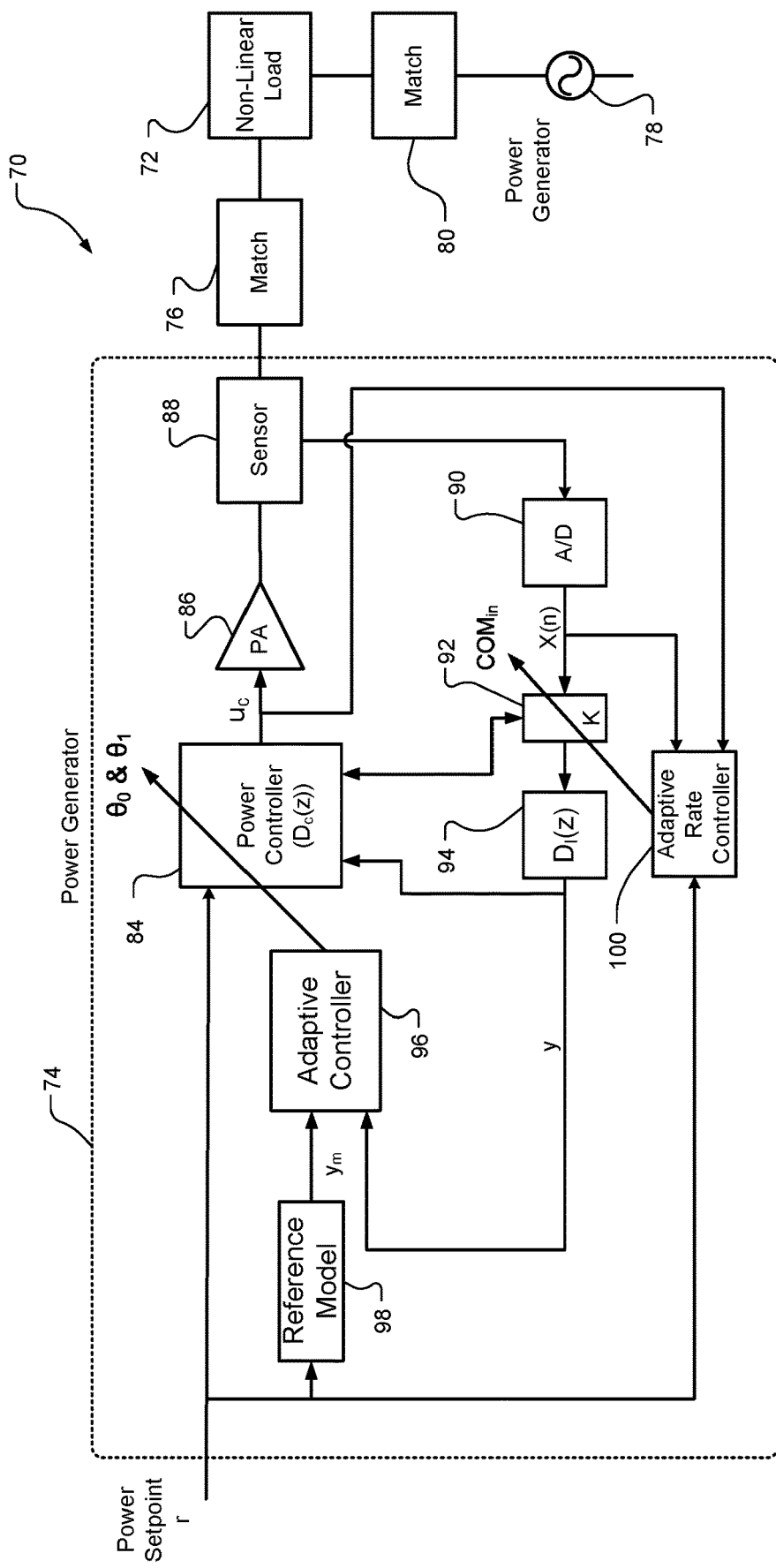
FIG. 4A is a schematic block diagram of a power generation system for driving a non-linear load.

FIG. 4A depicts a schematic block diagram of a power generation system 70 for driving a load. Power generation system 70 includes a non-linear load 72, such as a plasma chamber, having electrodes (not shown) powered by a first power generator 74 via a match or matching network 76. Non-linear load 72 is also powered by a second power generator 78 via a match or matching network 80. As shown in FIG. 4A, for RF power applications, power generator 74 is configured as a low frequency RF generator, such as for a bias RF generator, and generator 78 is configured as a high frequency RF generator, such as for a source RF generator.

In various embodiments, match networks 76, 80 may be combined into a single match network, rather than being configured as separate, individual match networks. When match networks 76, 80 are combined into a single match network, the output from the single match network is input to non-linear load 72. In such a configuration, both power generators 74, 78 drive the same electrode of non-linear load 72. In various embodiments, the other electrode of non-linear load 72 may be connected to a ground.

Power generator 74 includes power controller 84 ($D_C(z)$) which generates a control signal applied or communicated to power amplifier 86. The control signal applied to power amplifier 86 may include one or a plurality of signals to control one or more electrical parameters of power amplifier 86, including voltage, current, frequency, and rail value. The control signal applied to power amplifier 86 is an analog signal. The type and content of the control signal may depend on the type of class of the power amplifier 86. Power amplifier 86 outputs an amplified signal (DC or RF) to sensor 88. Sensor 88 senses the signal output by power amplifier 86 and also passes the amplified power through to match network 76 for application to non-linear load 72. Sensor 88 may be configured as an integral or a separate component of power generator 74. Sensor 88 generates an output signal, either a voltage and current or a forward and reverse power signal to A/D converter 90. A/D converter 90 converts the analog signals received from sensor 88 into digital signals and outputs the digital signal X(n) to scaling module 92, which applies a scaling factor K, and to adaptive rate controller 100. Scaling factor K compensates for the sensor output to generate a continuous time, sampled signal. The output from scaling module 92 is applied or input to transfer function module 94, represented as $D_f(z)$, which outputs a signal y representative of the output from power amplifier 86. The measured signal y is applied to power controller 84 and to adaptive controller 96. Scaling module 92 also communicates with power controller 84 via a communications link which, in various embodiments, enables sharing of internal direct digital synthesizer (DDS) information to enable synchronizing their respective DDSs.

The transfer function $D_f(z)$ shapes the closed loop control response. In various embodiments $D_f(z)$ provides filtering in order to shift poles and zeros of the closed loop transfer function for the control loop of power generator 74, thereby improving the responsiveness of the control loop. $D_f(z)$ may be implemented in one of a lead filter, lag filter, or lead/lag filter. In various embodiments, $D_f(z)$ may be defined as shown below in equation (1):

$$D_l(z) = K_d \frac{z - z_0}{z - z_p}, z_0 > z_p \quad (1)$$

where:
  $z_0$ is a zero of $D_f(z)$; and
  $z_p$ is a pole of $D_f(z)$.
In various embodiments, implementing $D_f(z)$ as a lead filter yields a more responsive closed loop transfer function and accelerates transients through the control loop.

Adaptive controller 96 receives as inputs a modeled output signal $y_m$ output by reference model 98, and a measured representation y of the output from sensor 88. Adaptive controller 96 receives the two inputs and generates adaptive signals $\theta_0$ and $\theta_1$ for adaptively adjusting operation of power controller 84. FIG. 4A also includes an adaptive rate controller 100 which receives as input power setpoint r, which defines at least one electrical parameter to be output by power generator 74, a representation of the control signal from power controller 84, and the signal X(n) from A/D converter 90. As will be described in greater detail herein, adaptive rate controller 100 outputs signals to vary the scaling factor K, to thereby adaptively adjust scaling operation of scaling module 92. In various embodiments, adaptive rate controller 100 receives signals indicative of one or more commanded electrical parameters from other than power controller 84, such as from power generator 78 or another external power generator. In various other embodiments, adaptive rate controller 100 can receive a sensed signal from other than A/D converter 90, such as from power generator 78 or other external power generator.

Figure 4B:
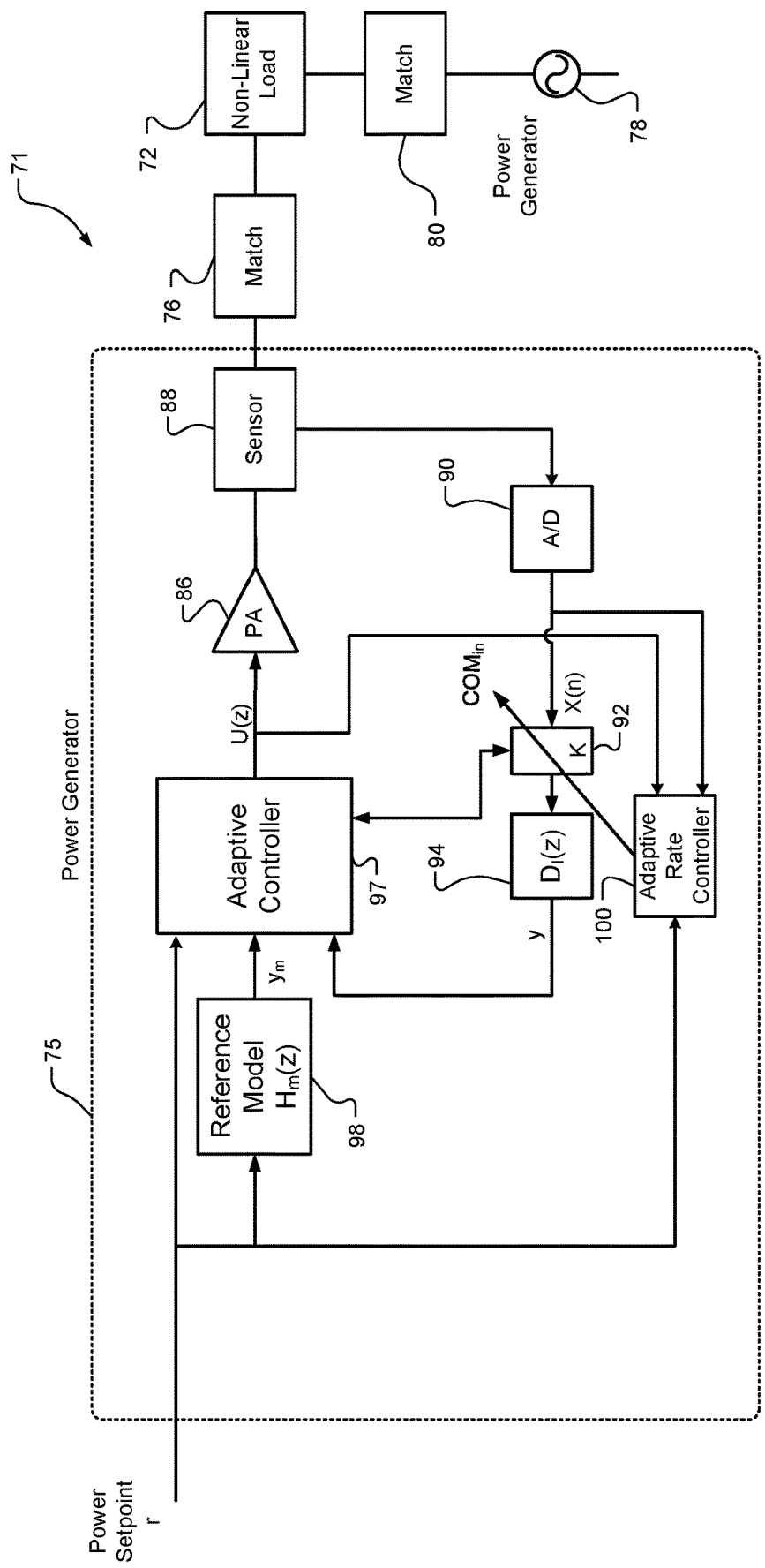
FIG. 4B is a schematic block diagram of another embodiment of the power generation system of FIG. 4A.

FIG. 4B depicts a schematic block diagram of another embodiment of a power generation system 71 comprising a power generator 75 for driving the load shown in FIG. 4A. The power generation system 71 (specifically the power generator 75) differs from the power generation system 70 (specifically the power generator 74) shown in FIG. 4A in that the power controller 84, $D_c(z)$, shown in the power generation system 70 is omitted in the power generation system 71; and a adaptive controller 97 in the power generation system 71 directly receives the input power setpoint r along with power feedback signal (y) and the output of the reference model ($y_m$). The input power setpoint r may be a forward power setpoint or a load leveling setpoint. The adaptive controller 97 generates a control signal applied or communicated directly to the power amplifier 86. Throughout the disclosure, the power generation systems 70 and 71 may be used interchangeably. All other elements of the power generation system 71 operate as described with reference to FIG. 4A and are therefore not described again for brevity.

Figure 5A:
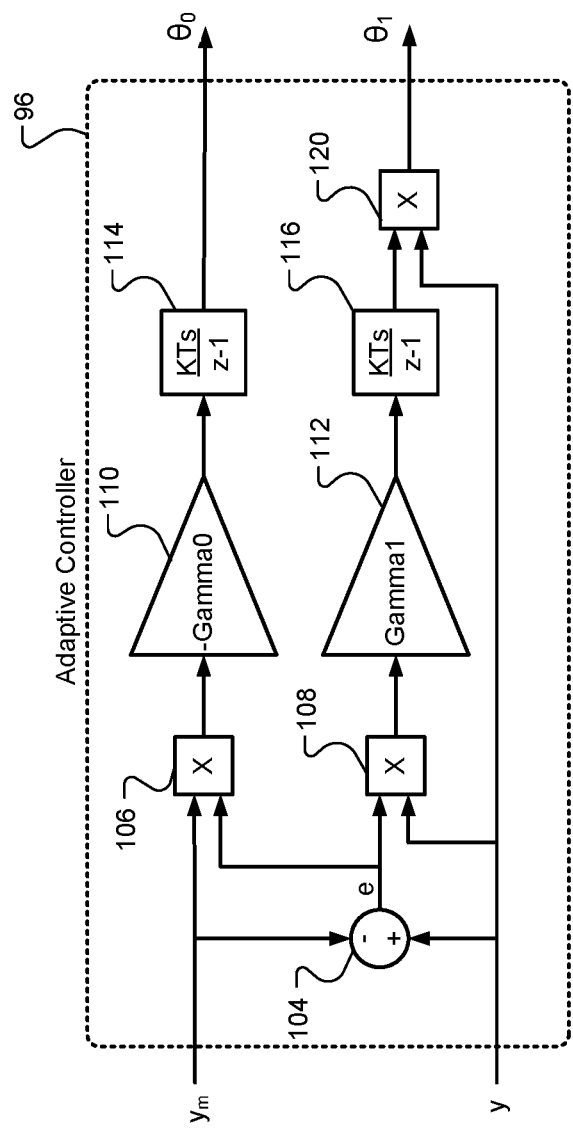
FIG. 5A is a schematic block diagram of the adaptive controller of FIG. 4A according to various embodiments.

FIG. 5A depicts an expanded block diagram of adaptive controller 96. Adaptive controller 96 receives a signal y from transfer function $D_f(z)$ 94 indicating the measured output y of power amplifier 86, such as power, forward power, reverse power, voltage or current. Adaptive controller 96 receives a predicted output $y_m$ of power amplifier 86 as determined by reference model 98, as will be described in greater detail herein. Adaptive controller 96 includes a summer 104 which determines a difference or error e between measured output y and predicted output $y_m$. The error is applied to a pair of multipliers or mixers 106, 108. Mixer 106 also receives the predicted output $y_m$ so that the predicted output $y_m$ is mixed with the error value e. The error value e is also input to mixer 108 along with the measured output y so that the error value e and the measured output y are mixed at mixer 108.

Reference model 98 simulates the desired plant dynamics of the system using a transfer function $H_m(z)$ as described below in equation (2):

$$H_m(z) = \frac{Y(z)}{R(z)} \quad (2)$$

where
  Y(z) is the reference model system transfer function output; and
  R(z) is the reference model system transfer function input.
Thus, reference model 98 applies a transfer function to the setpoint r in order to determine a predicted output based upon the transfer function $H_m(z)$. As described herein, the predicted output $y_m$ of reference model 98 is compared to the measured output y of power generator 74 to determine the difference or error. While reference model 98 is described herein with the transfer function $H_m(z)$, other models may be employed in reference model 98. For example, reference model 98 may employ a state space model or linear quadratic integral (LQI) model or a Kalman filter or linear quadratic estimate (LQE) model.

The output from mixer 106 is applied to scalar 110 which applies a scaling value—Gamma0 to the output from mixer 106. Similarly, the output from mixer 108 is input to scalar 112 which applies a scaling factor Gamma1 to the output from mixer 108. Scalars 110 and 112 scale the outputs from the mixers in order to determine a learning rate for adaptive controller 96. The output from scalar 110 is input to integrator 114, and the output from scalar 112 is input to integrator 116. The output from integrator 114 defines an adaptive rate value $\theta_0$ which is input to power controller 84. As will be described in greater detail herein, $\theta_0$ defines a rate of adjustment of a control signal output to power amplifier 86. The output from scalar 112 is input to integrator 116 which outputs an integrated value to mixer 120. Mixer 120 mixes the integrated value output from integrator 116 with the measured output y to generate $\theta_1$. As will be described in greater detail herein, $\theta_1$ represents an offset to the control signal scaled by $\theta_0$. Throughout the disclosure, Gamma0, $\gamma_0$, and $\theta_0$ are used interchangeably and synonymously to denote feedforward path; and Gamma1, $\gamma_1$, and $\theta_1$ are used interchangeably and synonymously to denote feedback path.

Figure 5B:
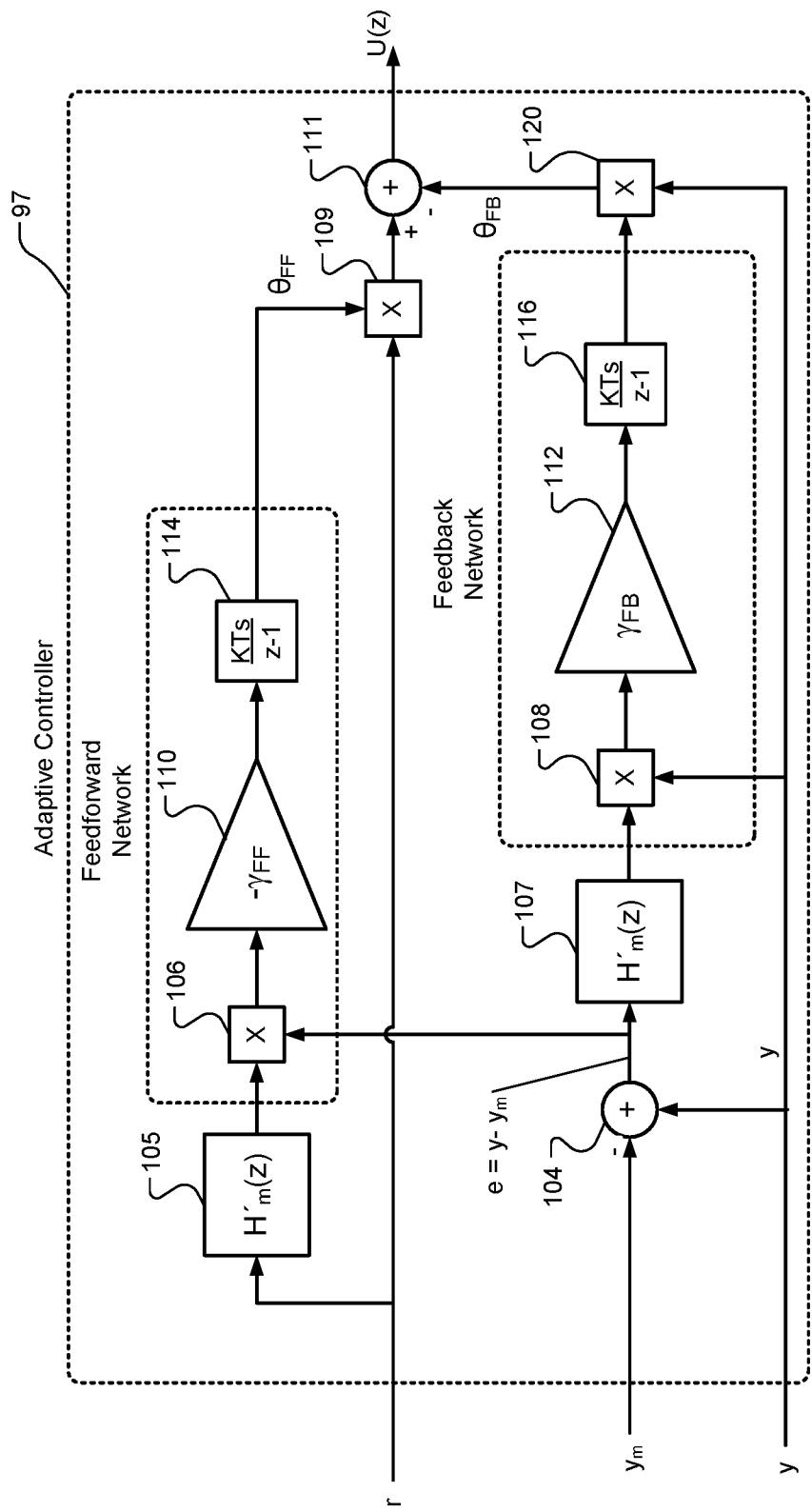
FIG. 5B is a schematic block diagram of another embodiment of the adaptive controller of FIG. 4B.

FIG. 5B depicts another embodiment of the adaptive controller shown as adaptive controller 97. The adaptive controller 97 comprises a feedforward network and a feedback network. The feedforward network includes elements 106, 110, and 114 described above with reference to FIG. 5A. The feedback network includes elements 108, 112, and 116 described above with reference to FIG. 5A. Throughout the disclosure, the adaptive controllers 96 and 97 may be used interchangeably.

In FIG. 5B, the feedforward network processes as inputs a filtered version of the input power setpoint r, which is provided by a transfer function 105 ($H'_m(z)$), and an error (e) between the reference model output ($y_m$) and a system feedback (y). The feedback network processes as inputs a filtered version of the following signals, which is provided by a transfer function 107 ($H'_m(z)$): the reference model output ($y_m$), an error (e) between the reference model output ($y_m$), and the system feedback (y). The transfer function ($H'_m(z)$) is characteristically related to the transfer function ($H_m(z)$) used to implement the reference model 98 and can be set in accordance with the desired operation of the transfer function ($H_m(z)$). In some embodiments, the transfer function ($H'_m(z)$) may not be related to the transfer function ($H_m(z)$).

Both feedforward and feedback networks form a product from their respective inputs to generate a result that is scaled and integrated. The scaling by the feedforward network is performed by $-\gamma_0$ (shown as $-\gamma_{FF}$). The scaling by the feedback network is performed by $\gamma_1$ (shown as $\gamma_{FB}$). The feedforward network produces the output $\theta_0$ (shown as $\theta_{FF}$) that is multiplied by the input power setpoint r by a multiplier 109. This product (i.e., the output of the multiplier 109) is added to the output of the feedback network $\theta_1$ (shown as $\theta_{FB}$) by an adder 111. The final result of the adaptive controller 97 (i.e., the output of the adder 111) is coupled to drive the input of the power amplifier 86.

In the adaptive controller 97, there are scalars assigned to the feedforward and feedback networks. While the scalars can take on different values, for computational efficiencies, preferred values are for $\gamma_0 = \gamma_1$. In this case, note that $\gamma = \gamma_0 = \gamma_1$. The determination of this scalar drives the learning rates for the respective networks. An online recursion process is used to tailor the response for an optimal adaption rate, $\gamma$.

For a power amplifier, the gain of the learning rate follows a power law curve, $\gamma = aP^b$, where P represent the power setpoint, and where a and b are parameters describing the power response. Applying $\log_{10}$ to the function $\gamma = aP^b$ yields the following Equation (3):

$$\log_{10}(\gamma_i) = \log_{10}(a) + b \cdot \log_{10}(P_i) \forall i \quad (3)$$

where
i denotes the sampled power law curve function's data points.
By least squares, the above equation can be solved for optimal parameters a and b using Equation (4):

$$x = (A^T A)^{-1} A^T \log_{10}(\gamma_i) \quad (4)$$

where
$x = [b \; \log_{10}(a)]^T$, and
A is a matrix formed with first columns of $\log_{10}(P_i)$ and a second unity column.

To determine the best adaption rate, $\gamma$, a recursion is devised around the least square approach. First, a vector x is computed by least squares approximation to describe the ideal power law curve. A second least square approximation is built using the actual power readback, $\hat{P}_i \forall i$, with the $\hat{A}$ matrix formed with first columns of $\log_{10}(\hat{P}_i) \forall i$ and a second unity column.

By least square, the power law curve parameters are estimated using the Equation (5):

$$\hat{x} = (\hat{A}^T \hat{A})^{-1} \hat{A}^T \log_{10}(\gamma_i) \quad (5)$$

where
$\hat{x} = [\hat{b} \; \log_{10} \hat{a}]^T$.
An error function, $\hat{e}$, is formed from the power law curve generated by:

$$c = 10^{\log 10(a)} P_i^b \quad (6)$$

and $$d = 10^{\log 10(\hat{a})} \hat{P}_i^{\hat{b}} \quad (7)$$

by $$\hat{e} = c - d. \quad (8)$$

The recursion process concludes with an update to the lower law curve function with using Equation (9):

$$c_{new} = c + g\hat{e} \quad (9)$$

where
g is a gain parameter scaling the error to the new parameterized power law curve $c_{new}$.
This new power law curve function is parameterized by least square using the following Equation (10):

$$\bar{x} = (A^T A)^{-1} A^T \log_{10}(c_{new,i}) \quad (10)$$

for
$\bar{x} = [\bar{b} \; \log_{10} \bar{a}]^T$.
The new adaption rate is then formed by the Equation (11):

$$\gamma = 10^{\log 10 \bar{a}} P^{\bar{b}}. \quad (11)$$

Thus, the estimation of $\bar{x}$ is continually improved.

The incorporation of a reference model and adaptive model enables a significant feature to the deployed control system. The objective of the adaptive controller is to tailor the response of the plant toward the response of the reference model. The feedforward path adjusts the setpoint with the power setpoint and the error between the power system feedback and the reference model output. Additionally, the feedback path additively adjusts the setpoint with the power system feedback and the error between the power system feedback and the reference model output. From the information of the reference model and the response of the feedforward and feedback networks, an in-line system identification is formulated. A continuous time, second order plant transfer function with a zero has a discrete time describing transfer by the following Equation (12):

$$H(z) = \frac{z^2 - bz}{z^2 - a_1 z + a_0}. \tag{12}$$

If the reference model transfer function in discrete time is defined as Equation (13):

$$H_m(z) = \frac{z^2 - b_m z}{z^2 - a_{m1} z + a_{m0}}, \tag{13}$$

then using the elements of the adaptive controller and the parameterized reference model, the power system transfer function can be identified as Equations (14), (15) and (16):

$$b = \frac{b_m}{\theta_0}, \tag{14}$$

$$a_0 = a_{m0} - \theta_1 b, \text{ and} \tag{15}$$

$$a_1 = a_{m1} - \theta_1. \tag{16}$$

Figure 6:
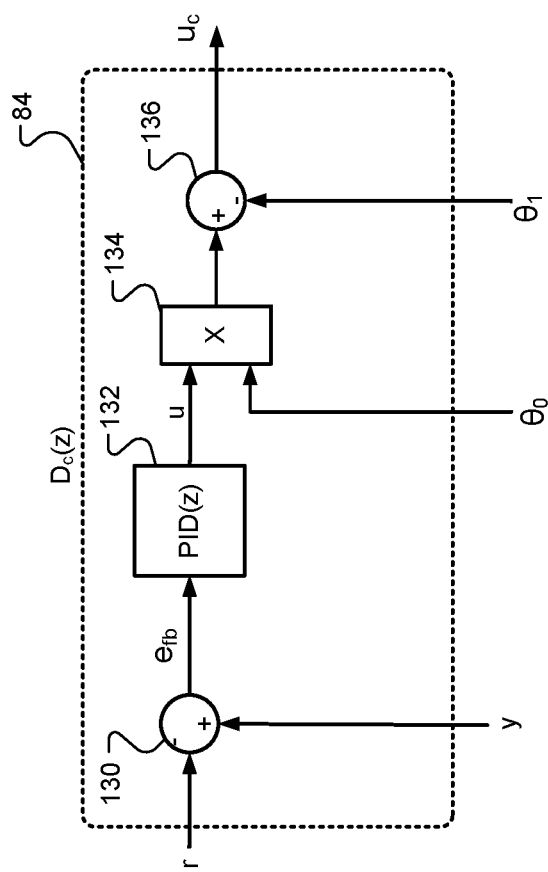
FIG. 6 is a schematic block diagram of the power controller of FIG. 4A according to various embodiments.

FIG. 6 represents a block diagram of power controller $D_C(z)$ 84. Power controller 84 receives setpoint r, measured electrical parameter value y, $\theta_0$, and $\theta_1$. The setpoint r and the measured output y is input to summer 130 which determines an error value $e_{fb}$ applied to a controller 132. Controller 132 may be implemented as a proportional-interval-derivative (PID) controller, a state-model controller, or any other controller known in the art. Controller 132 generates a control signal u in accordance with the input error $e_{fb}$. The control signal u is mixed with $\theta_0$ at mixer 134. Thus, $\theta_0$ provides a feedback value for scaling control signal u. The scaled value of u is then input to summer 136 which subtracts the value $\theta_1$ from the scaled value to output a control signal u applied to power amplifier 86 of FIG. 4A. The value $\theta_1$ provides a feedforward value for offsetting $u\theta_0$. Thus, $u_c = u\theta_0 + \theta_1$, and the control signal $u_c$ is an adapted representation of u.

In various embodiments, the control system of power generator 74 includes a control loop having an inherent lag or delay between the initiation in a change of a control parameter and the output changing in response to adjusting the control parameter. The delay is referred to as a digital group delay, digital delay, or digital analysis delay and is generally defined as the time between initiation of a change and the actual occurrence of the requested change. Other delays exist in power generator 74. For example, power amplifier 86, sensor 88, and power controller 84 include an inherent delay between receiving an input signal to vary the output of power amplifier 86 and the actual change in the output of power amplifier 86. This delay is referred to as a power supply delay, $T_{PS}$. In fact, in various configurations, the power supply delay can be four times greater than the digital group delay. While a digital group delay of less than the power supply delay is generally desirable, such a difference presents certain challenges and opportunities. In particular, with a group delay less than the power supply delay, the control loop can sample the power amplifier output multiple iterations before the power amplifier exhibits a change.

In various embodiments, adaptive controller 96 and adaptive rate controller 100 cooperate to match the system constraints of a digital group delay with the power supply constraints. For example, adaptive controller 96 reduces the digital group delay by generating scaling terms $\theta_0$ and $\theta_1$ to accelerate learning and adjustment of power controller 84. Another approach to match the system constraints with the power supply constraints is to adjust the scaling factor K of scaling module 92. In various embodiments, the scaling factor K of scaling module 92 compensates for the sensed to actual continuous time sampled signals.

Figure 7:
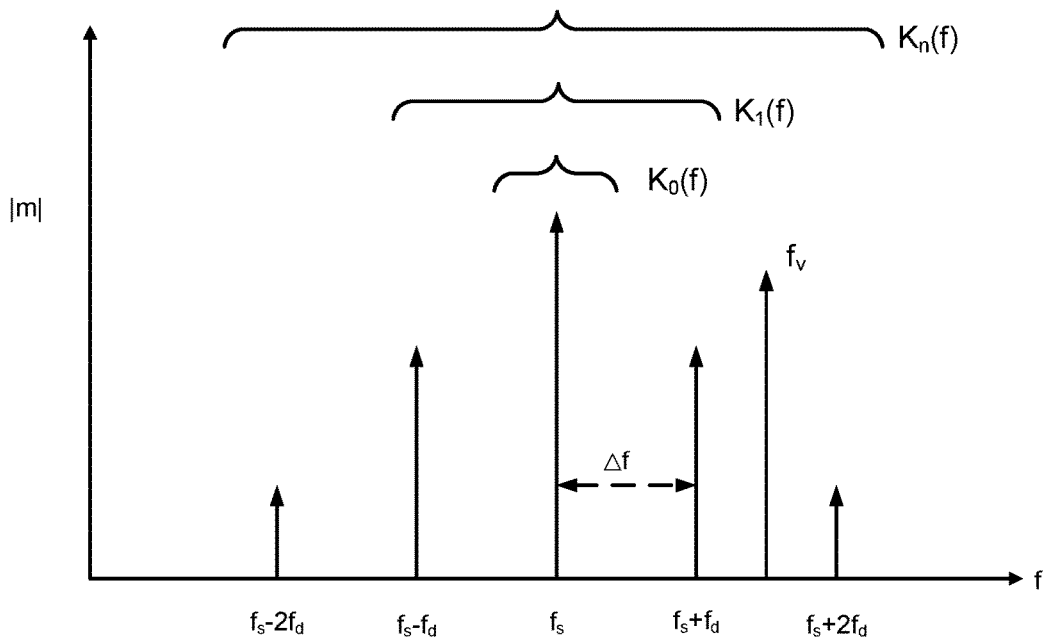
FIG. 7 depicts a frequency plot of a predetermined operating frequency and intermodulation distortion (IMD) frequencies resulting from distortion frequencies for a power generation system.

FIG. 7 depicts a plot of frequency versus amplitude of the output from sensor 88 shown as m. In FIG. 7 $f_s$ is the setpoint frequency and $f_d$ is a distortion frequency introduced through non-linear load 72, such as by a second power source, such as that applied by power generator 78 in FIG. 4A. FIG. 7 depicts a setpoint frequency $f_s$ and coupled power about the setpoint frequency $f_s$. The coupled power is a power at $f_d$ or a different power, such as at $f_v$, as shown in FIG. 7. The coupled power at $f_d$ represents distortion power, such as from a second power generator, such as power generator 78. Thus, $f_s \pm f_d$ and $f_s \pm 2f_d$ represent intermodular distortion (IMD) between $f_s$ and $f_d$. The coupled power at $f_v$ represents an inherent capacitive or inductive coupling within non-linear load 72. Note that Δf defines the bandwidth of the controller, where it is generally desirable to have a bandwidth sufficiently narrow to exclude coupled power, such as $K_0(f)$ in FIG. 7.

Referring to scaling module 92 of FIG. 4A and to FIG. 7, setting K determines the bandwidth about the frequency $f_s$ for a given K. For example, bracket $K_0(f)$ represents a $K_0(f)$ having a bandwidth wide enough to detect $f_s$ while excluding coupled power. Similarly, the bracket represented by $K_1(f)$ indicates a K having a bandwidth sufficient to capture $f_s \pm f_d$, and the bracket $K_n(f)$ represents a K having a bandwidth sufficient to capture $f_s \pm 2f_d$. In terms of response, $K_0(f)$ represents a slower response or narrower bandwidth than $K_n(f)$.

Figure 8:
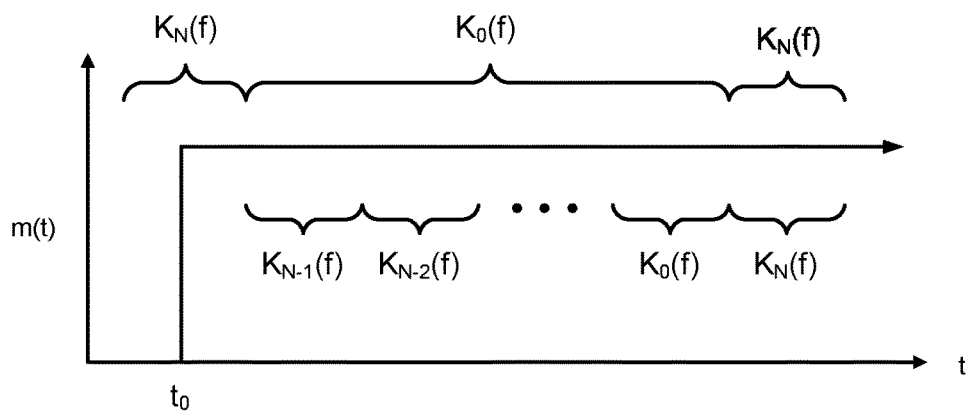
FIG. 8 is a waveform of an example signal output by the power generator of FIGS. 4A and 4B.

FIGS. 7 and 8 indicate a benefit of an adaptive rate controller 100 varying K in scaling module 92. FIG. 8 represents the output of sensor 88 as a function of time, m(t). As seen in FIG. 8, m(t) is a step function with the output increasing at $t_0$. With reference to adapting the constant K in scaling module 92, there is a benefit to setting K to $K_n(f)$ around $t_0$ to provide the fastest response and highest bandwidth for detecting the transient at time $t_0$. Following the transient $t_0$, the K in scaling module 92 can be set to $K_0$ since a slower, narrow bandwidth is sufficient to capture variations in m(t) during a steady state. In various embodiments, K can transition or commutate gradually from $K_n$ to $K_{n-1}(t)$ to $K_{n-2}(t)$, . . . , $K_0$, as also shown in FIG. 8. FIG. 8 thus represents a possible adaptation of K for a RF continuous wave or DC drive configuration.

Figure 9:
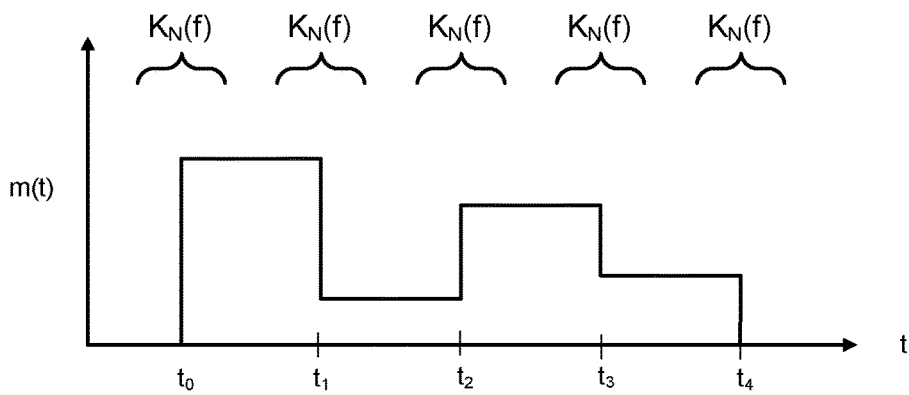
FIG. 9 is an example waveform of a variable signal output by the power generator of FIGS. 4A and 4B.

FIG. 9 represents a pulsed DC or pulsed RF waveform m(t) as a function of t. At each transition $t_0$, $t_1$, $t_2$, $t_3$, and $t_4$, K of scaling module 92 can be set to $K_n(f)$ to provide the highest bandwidth and best response to detect the transient at these times. Between the time $t_0, t_1, \ldots, t_4$, the scaling factor K can be set to a K having a slower bandwidth, such as $K_{n-1}(t), \ldots, K_0$. In FIG. 9, K can be commutated between each transient as shown at FIG. 8. Note that waveform m(t) in FIG. 9 can be a repeating pulse with transitions occurring at $t_0, t_1, t_2, t_3$, and $t_4$. In various embodiments, time $t_4$ can define a period, and waveform m(t) can have a period of $t_4$. In various other embodiments, waveform m(t) can vary from period to period, or repeat from period to period. In various other embodiments, the time for a given period of m(t) can vary so that a period is not consistently equal to $t_4$.

Thus, from FIGS. 8 and 9, the constant K in scaling module 92 can be commutated for each change of setpoint or other property affecting the output of sensor 88.

Figure 10:
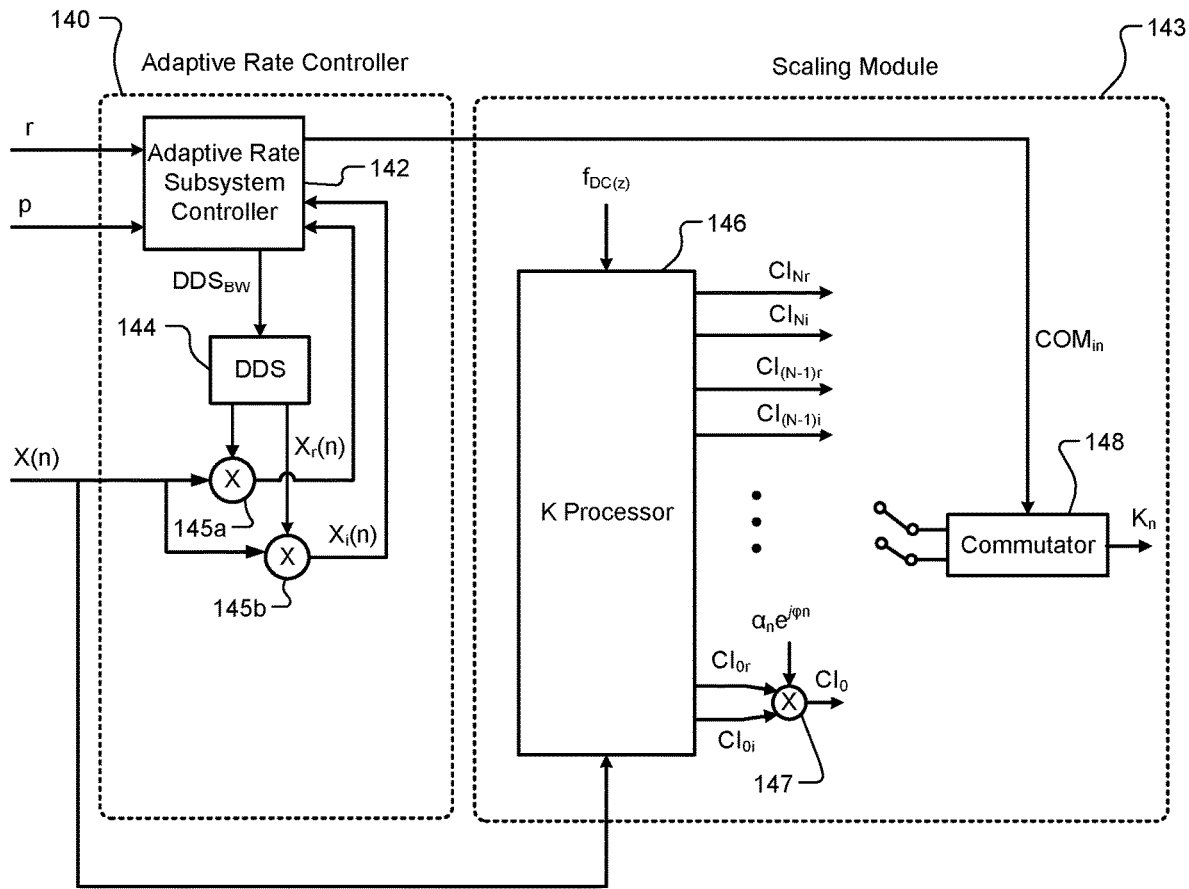
FIG. 10 is a schematic block diagram of an adaptive rate controller and scaling module of FIGS. 4A and 4B according to various embodiments.

FIG. 10 depicts adaptive rate controller 140 as an example of adaptive rate controller 100 of FIG. 4A and scaling module 143 as an example of scaling module 92 of FIG. 4A according to various embodiments. As described above with respect to FIG. 4A, adaptive rate controller 140 receives as inputs setpoint r, a parameter control output p, which represents a commanded output from power controller 84 to power amplifier 86, and X(n), which in various embodiments is a wideband signal from A/D converter 90. In various embodiments, setpoint r can represent the setpoint of a control parameter for power generator 74 that may be varied to correspondingly vary the output of power generator 74. Setpoint r can represent power, voltage, current, or frequency. Likewise, parameter control output p can be indicative of a control signal for a parameter output by power controller 84 for correspondingly controlling the output of power generator 74, and can include commanded power, voltage, current, frequency, or rail voltage.

Inputs r and p are input to adaptive rate subsystem controller 142. Adaptive rate subsystem controller 142 generates a control signal $DDS_{BW}$ to direct digital synthesizer (DDS) 144 in order to set the frequency of respective cosine and sine signals input to respective mixers 145a, 145b. Mixers 145a, 145b also receive X(n), and output respective real components of X(n), $X_r(n)$, and imaginary components $X_i(n)$ of X(n). In various embodiments, the output $DDS_{BW}$ of adaptive rate subsystem controller 142 input to DDS 144 is determined in accordance with parameter control output p so that the input signal to DDS 144 is selected such that DDS 144 outputs a frequency in accordance with parameter control output p. In various embodiments, parameter control output p represents a command frequency output by power controller 84 for power amplifier 86. DDS 144 outputs a frequency signal at substantially the same frequency as parameter control output p or with an offset. Respective real and imaginary components $X_r(n)$, $X_i(n)$ are fed back to adaptive rate subsystem controller 142 and processed to track the coupled power, such as described in FIG. 7 to determine the bandwidth Δf. U.S. Pat. No. 6,707,255, assigned to the assignee of the present application and incorporated by reference herein, describes various operations of a multirate processing arrangement including a digital frequency synthesizer and mixers for providing real and imaginary components of an input signal.

As will be described in greater detail below, K processor 146 receives the X(n) and, in various embodiments, a frequency setpoint signal $f_{DC(z)}$ for setting an output frequency of a DDS in K processor 146, and outputs commutator input (CI) values $CI_{0r}, CI_{0i}, CI_{(n-1)r}, CI_{(n-1)i}, CI_{Nr}, CI_{Ni}$ which represent various real and imaginary inputs for commutating K. In various embodiments, K processor 146 applies various operations to inputs X(n) including filtering, delay, downsampling, and decimation either individually or in combination. In various embodiments, K processor 146 outputs real and imaginary components. In various other embodiments, however, the real and imaginary components can be input to a mixer or multiplier, such as mixer or multiplier 147. An additional input, such as complex value $\alpha_n e^{j\varphi n}$, may also be input to mix the real and imaginary components and output a composite CI including both the real and imaginary components. Such an approach can be used to combine the real and imaginary components in any of the figures described herein which output individual real and imaginary components of a signal. Mixing with the complex value $\alpha_n e^{j\varphi n}$ also scales the output to a uniform magnitude and phase response. Although shown external to K processor 146 for descriptive purposes, mixing can be considered part of K processor 146 or separate from K processor 146.

The outputs from K processor 146 are selectively input to commutator 148. Commutator 148 selectively switches between $CI_{0r}, CI_{0i}, \ldots, CI_{(n-1)r}, CI_{(n-1)i}, CI_{Nr}, CI_{Ni}$ inputs for output from commutator 148 as a $K_n$ value. As will be recognized, if a pair of real and imaginary components are mixed, such as shown at mixer 147, only a single value is commutated via commutator 148. The output from commutator 148 represents a K for scaling module 92. Adaptive rate subsystem controller 142 communicates a control signal $COM_{in}$ to commutator 148 to control commutation through the various input signals. Subsystem controller 142 determines the signal $COM_{in}$ in accordance with Δf described above. Particularly, $\Delta f = \min(|f_s \pm nf_d|, f_v)$. Further, $COM_{in}$ varies as described below:

$$COM_{in} = K_n(f) \rightarrow \Delta f > f_{BWMAX}$$

$$COM_{in} = K_{n-1}(f) \rightarrow f_{BW(N-1)} \leq \Delta f < f_{BWMAX}$$

$$\ldots$$

$$COM_{in} = K_1(f) \rightarrow f_{BW1} \leq \Delta f < f_{BW(n+1)}$$

$$COM_{in} = K_0(f) \rightarrow \Delta f < f_{BW1}$$

In various embodiments adaptive rate subsystem controller 142 determines the bandwidth through detecting coupled power, such as IMD, as is well known in the art. Examples of determining coupled power, such as IMD, can be found in U.S. patent application Ser. No. 13/834,786, filed Mar. 15, 2013 and entitled Pulse Synchronization by Monitoring Power in Another Frequency Band and U.S. patent application Ser. No. 15/876,189, filed Jan. 21, 2018 and entitled Adaptive Counter Measure Control Thwarting IMD Jamming Impairments for RF Plasma Systems, both owned by the assignee of the present application and incorporated by reference herein.

Adaptive rate controller 140 and scaling module 143 of FIG. 10 describe a generalized representation of adaptive rate controller 100 and scaling module 92 of FIG. 4A. In various figures described throughout the specification, various portions of adaptive rate controller 140 and scaling module 92 may be omitted for the purpose of describing that particular figure. However, in various embodiments, such omitted components may still be considered part of the adaptive rate controller described in the respective figure.

Figure 11:
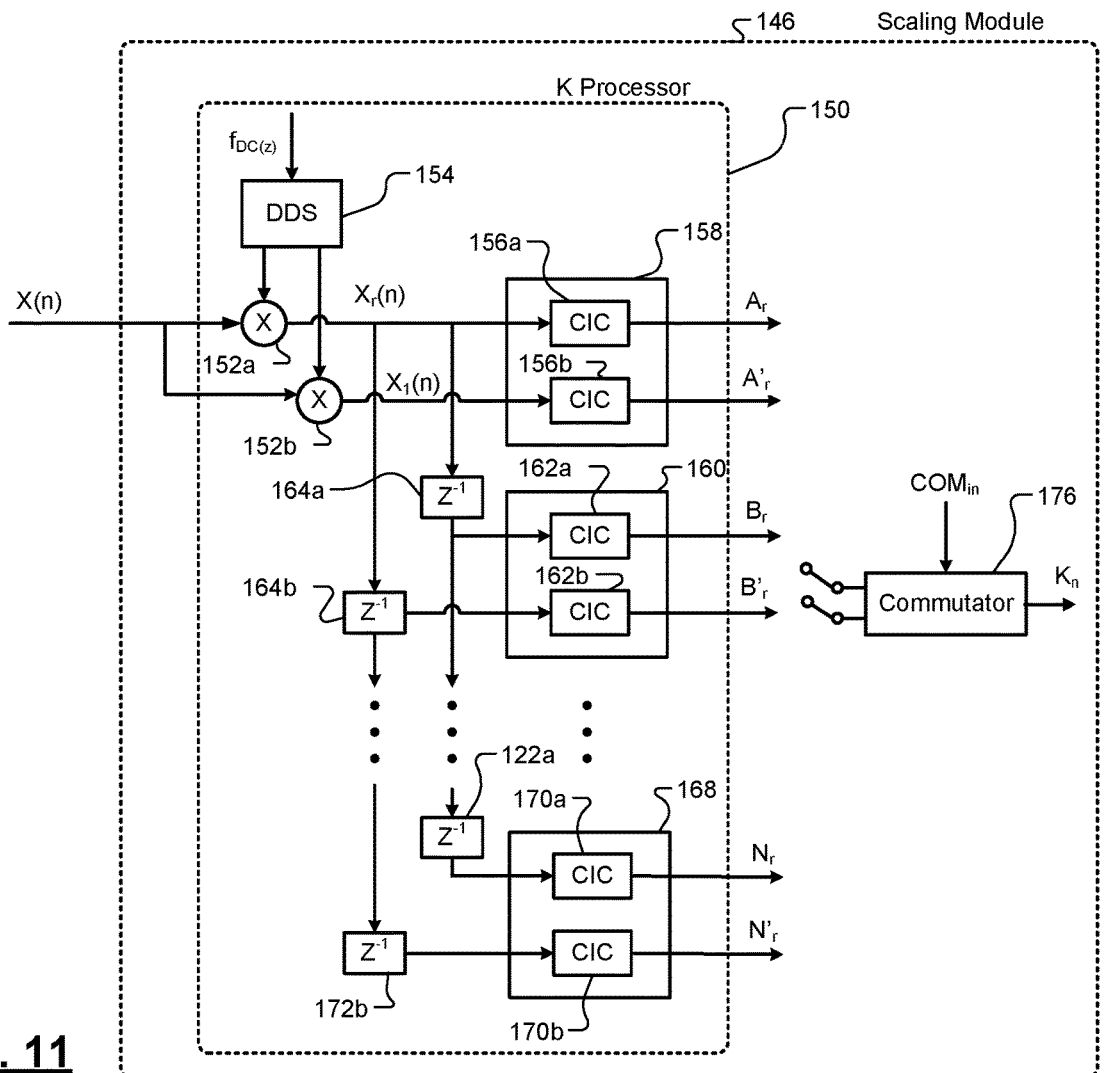
FIG. 11 is a schematic block diagram of portions of the scaling module of FIGS. 4A and 4B according to various embodiments.

Adaptive rate controller 100, 140 and scaling module 92, 143 affect the commutation of K and the resultant scaling of X(n) in various embodiments. In one embodiment, commutation can occur using cascaded integrator-comb (CIC) filters to decimate or downsample the output from an A/D converter, such as A/D converter 90. FIG. 11 shows one various embodiment of scaling module 146 and K processor 150. K processor 150 of FIG. 11 is embodied as a digital down converter. K processor 150 receives an input signal X(n), such as from A/D converter 90. X(n) is split and applied to a pair of mixers 152a, 152b. A direct digital synthesizer (DDS) 154 receives an input signal $f_{DC(z)}$ from power controller 84 and generates a sinusoidal signal also applied to respective mixers 152a, 152b. In various embodiments, $f_{DC(z)}$ is a signal that varies with respect to the operating frequency of a DDS in power controller 84, as power controller 84 and scaling module 92 are connected as shown in FIG. 4A. The connection of FIG. 4A symbolizes communication so that power controller 84 and scaling module 92 can share and possibly synchronize operating frequency information about their respective DDS. In various embodiments, $f_{DC(z)}$ may be used directly or offset prior to application or by DDS 154. In various embodiments, mixer 152a receives from DDS 154 a cosine function signal, such as cos(ωnt) for mixing with X(n) in order to generate a real component of X(n), $X_r(n)$. In various embodiments, DDS 154 generates a sine function signal, such as sin(ωnt) for mixing with X(n) and generate an imaginary component $X_i(n)$ of X(n).

Respective signals $X_r(n)$ and $X_i(n)$ are input to respective CIC filters 156a, 156b shown as a first CIC or decimation stage 158. CICs 156a, 156b downsample or decimate the respective real and imaginary components of X(n) to generate outputs $A_r$, $A_i$. K processor 150 also includes a second CIC or downsampling stage 160 having a pair of CIC filters 162a, 162b. Each CIC filter 162a, 162b receives a respective signal $X_r(n)$, $X_i(n)$ delayed by a predetermined delay $Z^{-1}$ as shown at respective delay elements 164a, 164b. An nth CIC or downsampling stage 168 includes CIC filters 170a, 170b receiving respective signals $X_r(n)$ and $X_i(n)$ cumulatively delayed by $Z^{-n}$ as shown by the cascaded delay element pairs 164a, 164b and 172a, 172b. Second CIC stage 160 outputs respective signals $B_r$ and $B_i$, and nth stage delay 168 outputs signals $N_r$ and $N_r$. Thus, K processor 150 includes n downsampling or decimation stages, each delayed by a predetermined delay $Z^{-1}$ through $Z^{-n}$. Each delay $Z^{-1}$ may be the same or may vary between each delay element. Scaling module 146 also includes a commutator 176 which has a pair of inputs for respectively commutating through outputs $A_r$, $A_i$; $B_r$, $B_i$; $N_r$, $N_i$. Scaling module 146 thus enables commutation through a series of phase delays starting with zero phase delay through $Z^{-n}$ phase delays.

Figure 12:
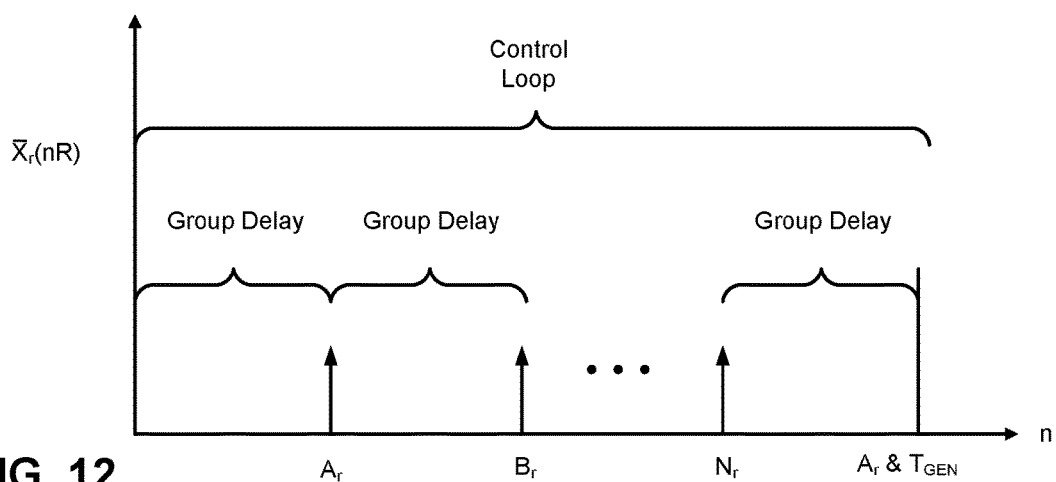
FIG. 12 is a plot of a relationship between example commutated outputs of FIG. 11 and a group delay and a control loop delay of a power generator.

FIG. 12 depicts a plot of the interaction between the group delay and the control delay using an adaptive rate controller, such as adaptive rate controller 148 of FIG. 11. In FIG. 12, the x-axis represents the delay n, and the y-axis represents the real component output by commutator 176 of FIG. 11, which operates as described above with respect to FIG. 10. As shown in FIG. 12, the group delay between the real components $A_r$, $B_r$, . . . , $N_r$ are equally spaced in accordance with the delays $Z^{-1}$ of FIG. 10. The group delays are arranged to synchronize with a power supply delay defined by $T_{GEN}$ or $T_{PS}$, which is the response time of the generator, such as power generator 74 of FIG. 4A. As shown, the N group delays fit equally within the power supply group delay. Thus, as shown in FIG. 12, the delay $Z^{-1}$ of FIG. 11 shifts the phase of the commutated K values to match the phase of the control loop for the RF generator $T_{PS}$, which is substantially defined by the response time from power amplifier 86.

Figure 13:
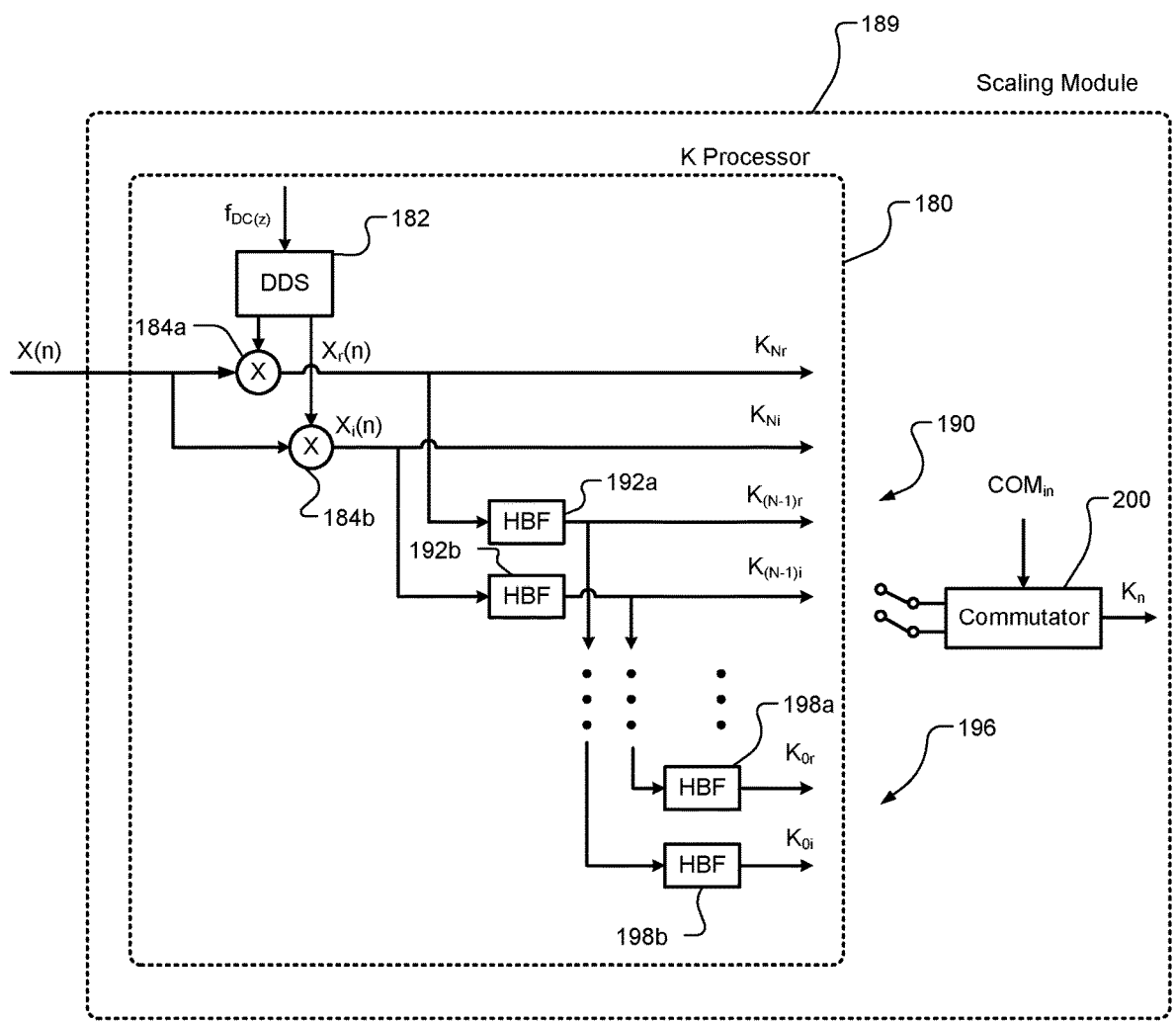
FIG. 13 is a schematic block diagram of portions of the scaling module of FIGS. 4A and 4B according to various embodiments.

FIG. 13 depicts a block diagram of one various embodiment of K processor 180 of one various embodiment scaling module 189. K processor 180 downsamples or decimates using half-band filters rather than CIC filters of FIG. 11. Further, rather than cascading delays as in FIG. 11, K processor 180 cascades downsampling or decimation signals to vary frequency. DDS 182 and multipliers 184, 186 operate similarly to those described in FIG. 11 to generate a real component $X_r(n)$ and an imaginary component $X_i(n)$. The real and imaginary components $X_r(n)$, $X_i(n)$ are output without filtering or downsampling at $K_{Nr}$ and $K_{Ni}$.

The real and imaginary components $X_r(n)$, $X_i(n)$ are also split and input to a first half-band stage 190 including respective half-band filters 192a, 192b which provide half-band filtering to respective signals $X_r(n)$ and $X_i(n)$. The half-band filters described herein are conventional half-band filters that operate as low pass filters and that reduce the maximum bandwidth of sample data by an approximate factor of two. Thus, the half-band filters described herein operate as down converters of the respective input signals. The output of respective half-band filters 192a, 192b, $K_{(N-1)r}$ and $K_{(N-1)i}$, respectively, represents downsampled signals of respective input signals $X_r(n)$, $X_i(n)$ at half the frequency of $X_r(n)$ and $X_i(n)$. The output of respective half-band filters 192a, 192b are input to an additional half-band stage 196 including half-band filters 198a, 198b. Half-band filter 198a receives signal $K_{(N-1)r}$, which has already been downsampled a first time by half-band filter 192a. Similarly, half-band filter 198b receives signal $K_{(N-1)i}$, which has already been downsampled via half-band filter 192b. N half-band filtering stages can be implemented in FIG. 13 to output $K_{0r}$ and $K_{0i}$ from stage 196. For example, FIG. 13 shows N stages total, including (N−1) downsampled stages and one stage not downsampled to output $K_{Nr}$, $K_{Ni}$.

With reference to FIG. 11 and FIG. 13, FIG. 11 effects a phase shift of the respective real and imaginary components of X(n). FIG. 13, on the other hand, implements cascaded frequency downsampling or decimation in order to vary K via frequency, rather than phase. The outputs of each respective stage are commutated via commutator 200, which operates similarly as described above with respect to FIGS. 10 and 11 scaling module 212 to output a $K_n$ in order to vary K.

Figure 14:
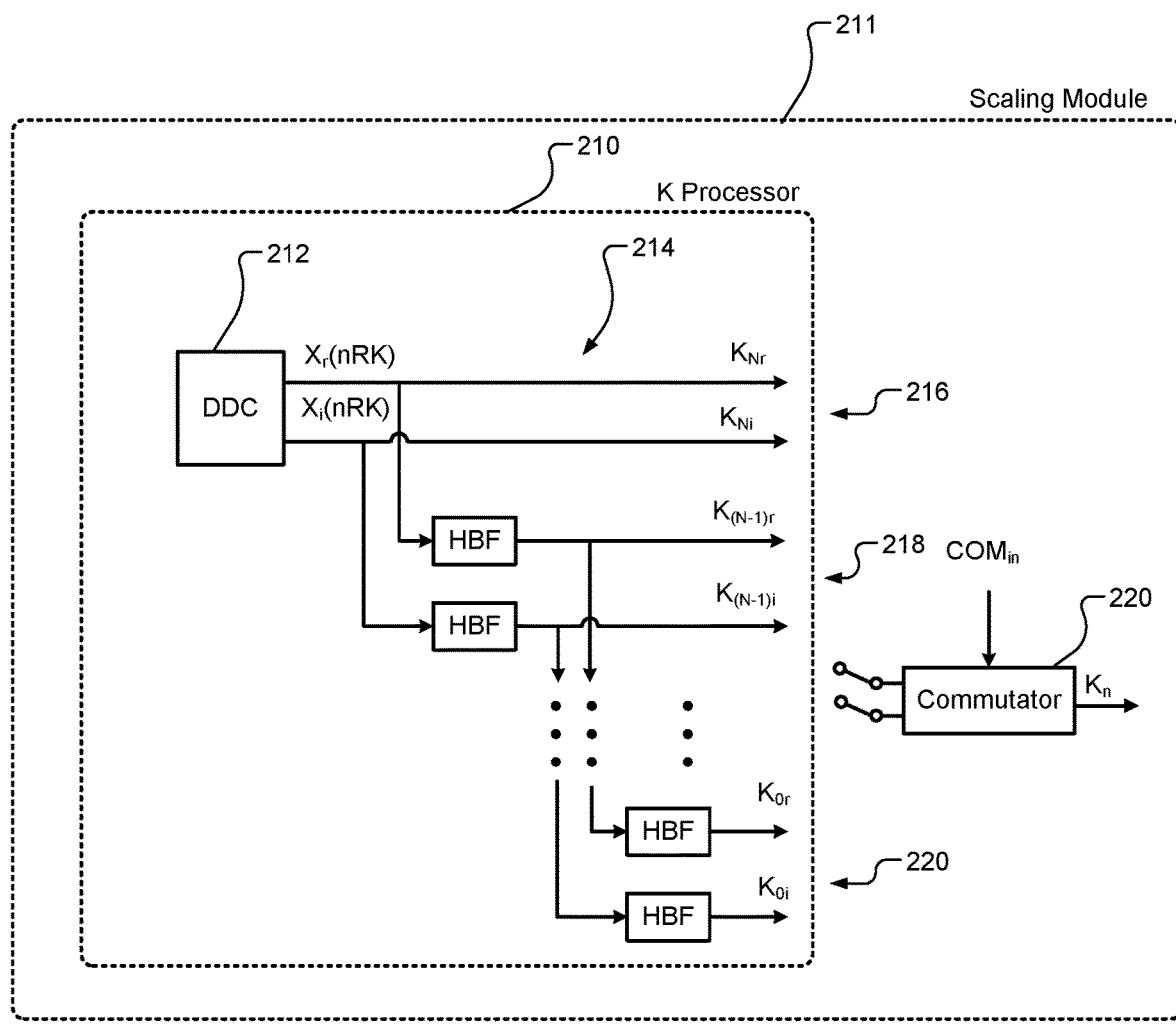
FIG. 14 is a schematic block diagram of portions of the scaling module of FIGS. 4A and 4B according to various embodiments.

FIG. 14 depicts one various embodiment of K processor 210 and scaling module 211, which is configured to commutate both the phase and frequency of K, thereby providing both phase and frequency variation of K. K processor 210 includes a digital down converter DDC 212 which may be arranged similarly to scaling module 146 of FIG. 11. The commutated output from digital down converter 212 includes both a real and imaginary components, $X_r(nRK)$, $X_i(nRK)$. These components represent the output of, for example, commutator 176 of FIG. 11. These components are input to half-band filter section 214, which operates similarly to that described above with respect to K processor 214 of FIG. 13 without DDS 182 and mixers 184a, 184b, as the real and imaginary components already exist in the input, where $X_r(nRK)$ and $X_i(nRK)$ are processed similarly to $X_r(n)$, $X_i(n)$ of FIG. 13. The half-band filter section 214 includes a direct output stage 216, a first downsampled stage 218, and a $(N-1)^{th}$ downsampled stage 220. The respective outputs from each stage of half-band down converter 214 are commutated through commutator 220 to output $K_n$. Thus, digital down converter 212 and half-band filter section 214 combine to implement a K processor, such as generally described at 146 of FIG. 10.

With reference to FIG. 12, K processor 210 of FIG. 14 enables variation of both the phase and the frequency of sampling. Thus, the digital group delay can be controlled in both phase and frequency to allow improved sampling across the entirety of the control loop.

Figure 15:
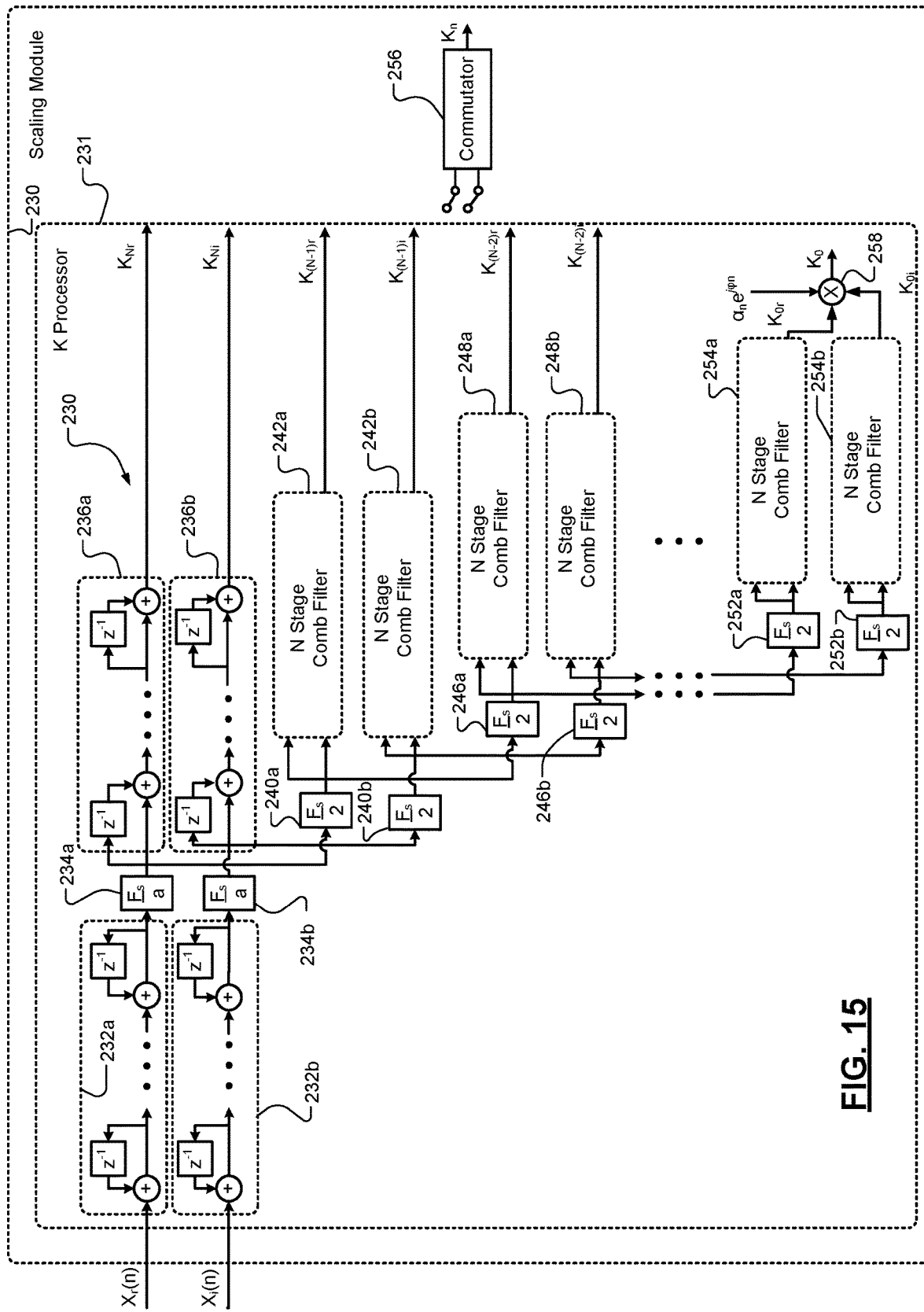
FIG. 15 is a schematic block diagram of portions of the scaling module of FIGS. 4A and 4B according to various embodiments.

FIG. 15 depicts yet another embodiment of a scaling module 230 and K processor 231. K processor 231 receives inputs $X_r(n)$, $X_i(n)$ which are generated as described above in FIGS. 11 and 12 in various embodiments by mixing sine and cosine signals from a DDS with X(n). The input $X_r(n)$, $X_i(n)$ signals are input to a N stage feedback comb filter to effect downsampling or decimation prior to input to respective frequency dividers 234a, 234b, where N may be any positive integer. Frequency dividers 234a, 234b are shown using the frequency dividing term $$\frac{F_s}{a},$$

where a is a predetermined value. For example, a can be any positive integer value. The frequency divided signal is output to respective N stage feedforward comb filters 236a, 236b, where N may be any positive integer. Comb filters 236a, 236b output respective downsampled, filtered signals $K_{Nr}$, $K_{Ni}$.

The output from frequency dividers 234a, 234b is also input to frequency dividers 240a, 240b which are shown as dividing the input frequency by two. In various embodiments, downsampling or decimation can also occur with a divisor of any positive integer. Frequency dividers 242a, 242b output frequency divided signals to respective N stage comb filters 240a, 240b, which in turn output frequency divided, filtered signals $K_{(N-1)r}$ and $K_{(N-1)i}$. A further frequency division/filter stage is provided by respective frequency divider 246a and N stage comb filter 248a for a real component and frequency divider 246b and N stage comb filter 248b for an imaginary component. N stage comb filters 248a, 248b output respective K values $K_{(N-2)r}$, $K_{(N-2)i}$. The frequency division/filtering is repeated down to a final stage to output $K_0$.

In the final stage, frequency dividers 252a, 252b receive respective real and imaginary components and output a further frequency divided signal to respective N stage comb filters 254a, 254b to output respective K values $K_{0r}$, $K_{0i}$. At the stage that outputs $K_0$, $K_{0r}$ and $K_{0i}$ are output to a multiplier 258 which also receives as input $\alpha_n e^{j\varphi n}$ to mix the real and imaginary components and output a composite $K_0$ including the real and imaginary components. As described above, such an approach can be used to combine the real and imaginary components in any of the figures described herein which output individual real and imaginary components of a signal. The $K_0, \ldots, K_N$ values are commutated via commutator 256, which operates as described above with respect to FIGS. 10, 11, 13, and 14.

Figure 16:
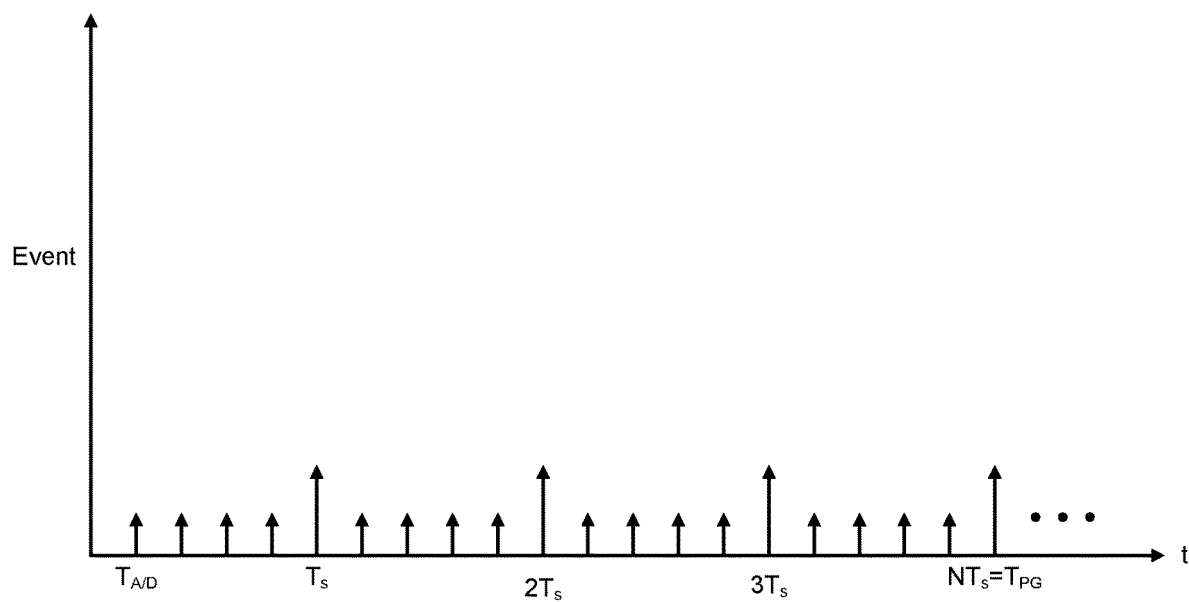
FIG. 16 is a plot of time versus sampling events to illustrate various frequency approaches.

FIG. 16 depicts a plot of time versus sampling events. In a typical power generator, frequency changes are implemented by simply updating from a first frequency to a second frequency. Conventionally, little regard is paid to the timing of frequency changes with respect to sampling events or the magnitude of the adjustment. With reference to FIG. 16, FIG. 16 depicts a chart of time with respect to various sampling events. For example, an A/D converter, such as A/D converter 90 of FIG. 4A, samples at a rate $T_{A/D}$. In various configurations, A/D converter 90 samples at a rate greater than the digital delay of power generator 74. Digital delay sampling events are indicated at $T_s$. In various configurations, it is generally desirable to have multiple A/D sampling events within a given digital group delay in order to improve signal to noise ratio and overall accuracy. Further, and as discussed above, multiple digital group delays can occur within the power generator or power supply delay $T_{PG}$. This is shown also in FIG. 16 in which N=4, where four digital group delays Ts occur within one power generator delay $T_{PG}$.

Further, in various power generator control implementations, it is known to increment the frequency from a first frequency to a second frequency using servo control to increment from the first frequency to the second frequency. An example of such incremental control can be found with respect to U.S. Pat. Nos. 8,576,013 and 8,781,415, assigned to the Assignee of the present application and herein incorporated by reference. One approach to incrementing the frequency setpoint from $F_s(k)$ to $F_s(k+1)$ can be found below with equation (17):

$$f_s(k+1) = f_s(k) + G[\gamma d_i(k) + \beta d_i(k-1) + \gamma d_i(k-2)] \quad (17)$$

where:
G is a transfer function to determine the frequency increment;
γ is a PID controller coefficient;
β is a PID controller coefficient; and
$d_i(k)$, $d_i(k-1)$, and $d_i(k-2)$ are the distortion values measured at the $k^{th}$, $(k-1)^{th}$, and $(k-2)^{th}$ increments.

From the above equation (17) the following equation (18) defines the change in the sampling frequency:

$$\Delta f_s = f_s(k+1) - f_s(k) \quad (18)$$

With reference to equations (17) and (18) and FIG. 16, according to various embodiments, the frequency updates at the sampling occurrences of one or a combination of $T_{A/D}$, $T_s$, and $T_{PS}$, or multiples thereof, in order to minimize disturbance of the system by changing the frequency at the time of sampling.

Accordingly, there are multiple approaches to effect such frequency updating. For example, assuming that the initial frequency is $F_{INITIAL}$ and the final frequency is $F_{FINAL}$ and that the $\Delta f_s = F_{FINAL} - F_{INITIAL}$. This frequency change from $F_{INITIAL}$ to $F_{FINAL}$ can be implemented over various increments occurring at the start of one or a combination of an A/D sampling, digital group delay, or power supply delay periods. For example, according to various embodiments, the frequency can be changed in its entirety at any one of a start of a $T_{A/D}$, $T_s$, and $T_{PS}$ periods. Alternatively, and according to various embodiments, the frequency can be changed incrementally at the start of each digital group delay $T_s$ period. That is, for N digital group delays in one power supply delay, increment at the start of each period $T_s$ is by $\Delta F_S/N$. According to various other embodiments, frequency can be adjusted similarly at the start of multiple power supply delays periods $T_{PS}$ over a predetermined number of power supply delays. That is, for example, assuming that it is desirable to change the frequency over M $T_{PS}$ periods, the $\Delta F_S$ can be determined in accordance with $\Delta F_S/M$ so that at each successive start of a power supply delay period, the frequency is incremented by the $\Delta F_S/M$. Further yet, according to various embodiments, frequency can be updated at various A/D periods $T_{A/D}$ within a one or multiple, predetermined digital group delay periods Ts. Further yet, the frequency can be updated at selected A/D sampling periods $T_{A/D}$ within a given digital group delay period Ts. By way of non-limiting example, a frequency increment can occur at, for example, every second A/D sampling periods $T_{A/D}$ within a digital group delay periods $T_s$.

Referring to the block diagram of FIG. 4A, in various embodiments, sensor 88 may be a voltage/current probe or a directional coupler. Regardless of whether sensor 88 is a voltage/current probe or a directional coupler, sensor 88 must be calibrated so that its output to power generator 74 can be used for analysis and control. Present approaches to calibration of sensors present challenges because the values used for calibration rely on values that create corresponding variability or noise in the resulting calibration determination. In various conventional configuration approaches, the calibration variables not only introduce noise, the calibration variables appear where the noise undesirably propagates through the process. Further, in normal sensor operation, detected values of voltage and current, detected as raw values, must be converted to values meeting National Institute of Standards and Technology (NIST) requirements. In cases of a directional coupler, values must be suitable for conversion to forward and reverse power from NIST voltage and current values. Such calculations require computational overhead, which can add to the group delay of power generator 74.

In operation, sensor 88 detects raw voltage and current values that vary as a function of time. That is, sensor 88 detects a raw voltage $V_{raw}(t)$ and a raw current $I_{raw}(t)$. The raw voltage and current values must be converted to calibrated values pursuant to NIST standards. For example, equation (19) below indicates the calibration equation:

$$\bar{y} = \bar{a}\bar{x} \quad (19)$$

Where:
  $\bar{y}$ is a matrix calibrated values of voltage and current;
  $\bar{a}$ is a matrix of values for converting the raw voltages to calibrated voltages; and
  $\bar{x}$ is a matrix of raw, uncalibrated values.

In greater detail, equation (20) below shows an expanded version of equation (19):

$$\begin{bmatrix} v(t) \\ i(t) \end{bmatrix} = \begin{bmatrix} V_c Z_{oc} & I_c Z_{sc} \\ V_c & I_c \end{bmatrix} \begin{bmatrix} V_{raw}(t) \\ i_{raw}(t) \end{bmatrix} \quad (20)$$

where:
  $v(t)$ and $i(t)$ are the calibrated, respective voltage and current as a function of time;
  $V_{raw}(t)$ and $i_{raw}(t)$ are the raw voltage and current values detected by the sensor;
  $V_c$ is as defined below;
  $I_c$ is as defined below;
  $Z_{oc}$ is the open circuit impedance of the sensor; and
  $Z_{sc}$ is the short circuit impedance of the sensor.

From equation (20), the raw values can be converted to NIST acceptable values.

$V_c$ is defined below with respect to equation (21):

$$V_c = \frac{\bar{V} - \bar{I} Z_{sc}}{V_L (Z_{oc} - Z_{sc})} \quad (21)$$

where:
  $\bar{V}$ is the raw voltage measured during the 50 ohm portion of VI sensor calibration;
  $\bar{I}$ is the raw current measured during the 50 ohm portion of the VI sensor calibration;
  $Z_{oc}$ and $Z_{sc}$ are as described above with respect to equation (20);
  $Z_L$ is the low impedance measurement provided by the NIST traceable impedance transfer standards; and $V_L$ is the voltage measurement provided by the NIST traceable power transfer standards.

Similarly, $I_c$ can is defined below with respect to equation (22):

$$I_c = Z_L \frac{\bar{I} Z_{OC} - \bar{V}}{V_L (Z_{oc} - Z_{sc})} \quad (22)$$

Forward power and reverse power can be defined below as shown in equations (23) and (24):

$$V_F = \tfrac{1}{2}(v(t) + Z_0 i(t)) \quad (23)$$

$$V_R = \tfrac{1}{2}(v(t) - Z_0 i(t)) \quad (24)$$

where $Z_0$ is the characteristic impedance, typically 50 ohms.

Further, $v(t)$ and $i(t)$ are complex quantities generally as defined below with respect to equations (25) and (26).

$$v(t) = |V| e^{-j(\omega t + \varphi_v)} \quad (25)$$

$$i(t) = |I| e^{-j(\omega t + \varphi_i)} \quad (26)$$

where:
  $\omega$ is the frequency;
  $t$ is time; and
  $\varphi_v$ and $\varphi_i$ are the respective phases for the voltage and current.

Referring to equations (19) and (20) and (25) and (26) above, $V_R$ and $V_F$ can be written as shown in equation (27) below.

$$\begin{bmatrix} V_F \\ V_R \end{bmatrix} = \frac{1}{2} \begin{bmatrix} \dfrac{I_c - V_c Z_o}{V_c I_c (Z_{oc} - Z_{sc})} & \dfrac{V_c Z_{oc} Z_o - I_c Z_{sc}}{V_c I_c (Z_{oc} - Z_{sc})} \\ \dfrac{I_c + V_c Z_o}{V_c I_c (Z_{oc} - Z_{sc})} & \dfrac{-(V_c Z_{oc} Z_o + I_c Z_{sc})}{V_c I_c (Z_{oc} - Z_{sc})} \end{bmatrix} \times \begin{bmatrix} V_{raw} \\ I_{raw} \end{bmatrix} \quad (27)$$

From this, forward power $P_F$ and reflected power $P_R$ can be written as shown in equation (28) below:

$$\begin{bmatrix} P_F \\ P_R \end{bmatrix} = \frac{1}{4|V_c I_c (Z_{oc} - Z_{sc})|^2} \left\| \begin{bmatrix} (I_c - V_c Z_o) & (V_c Z_{oc} Z_o - I_c Z_{sc}) \\ (I_c + V_c Z_o) & -(V_c Z_{oc} Z_o + I_c Z_{sc}) \end{bmatrix} \times \begin{bmatrix} V_{raw} \\ I_{raw} \end{bmatrix} \right\|^2 \quad (28)$$

Note that the squared term in equation (28) alleviates a square root function in real time, thereby further minimizing calculations. Thus, relying on equation (28) to determine power provides a much more efficient determination than conventional techniques. Further by removing the term $(Z_{oc} - Z_{sc})$ from the denominators of equations (21), (22), and (27), the calibration approach of equation (28) provides a significantly improved signal to noise ratio during calibration. The calibration approach of equation (28) also enables efficient implementation of directional coupler using the output signals from a voltage/current (VI) probe.

Figure 17:
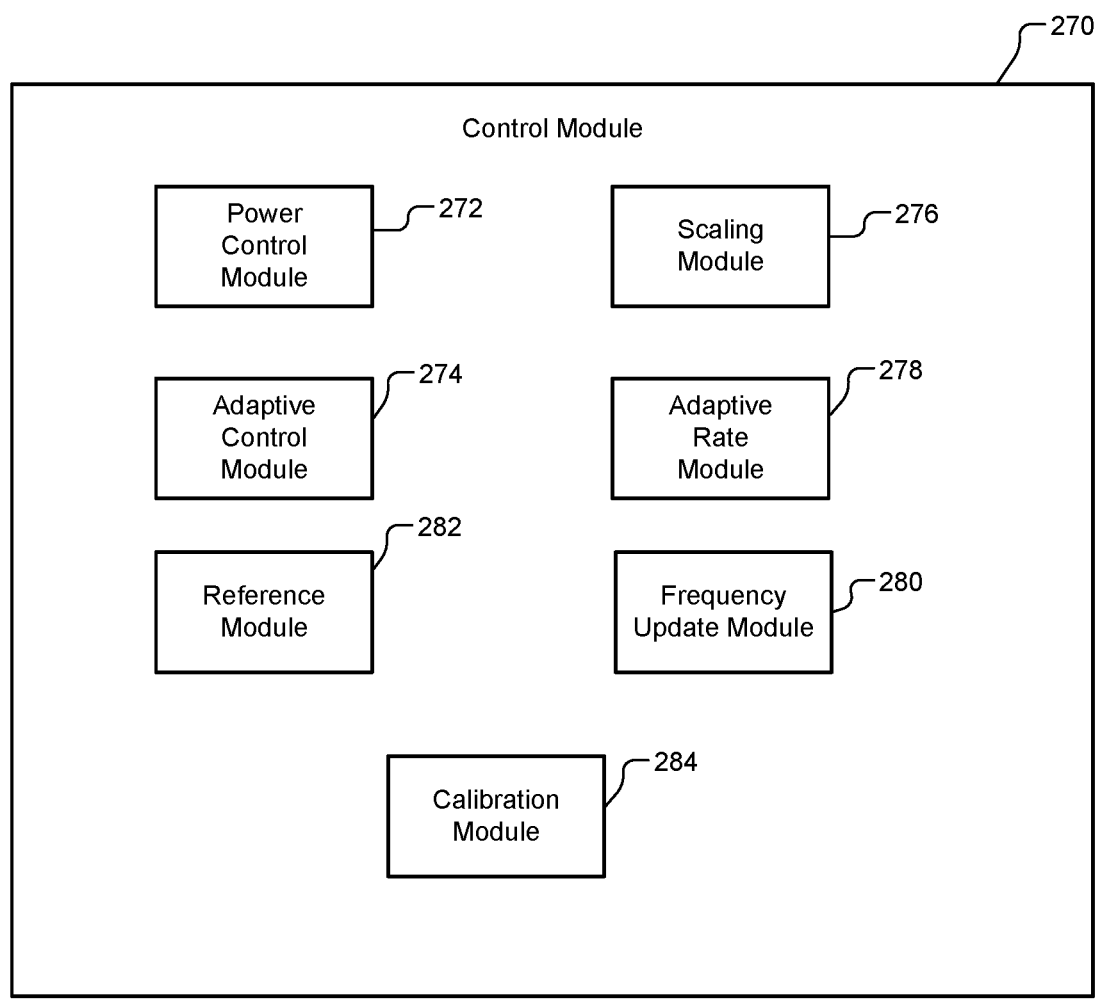
FIG. 17 is a functional block diagram of an example control module in accordance with various embodiments of the present disclosure.

FIG. 17 shows a control module 270. Control module 270 incorporates various components of FIG. 4A. Control module 270 may include power control module 272, adaptive control module 274, scaling module 276, adaptive rate module 278, reference module 282, frequency update module 284, and calibration module 286. In various embodiments, control module 270 includes one or a plurality of processors that execute code associated with the modules 272, 274, 276, 278, 280, 282, and 284. Operation of the modules 272, 274, 276, 278, 280, 282, and 284 is described below with respect to the method of FIG. 18.

Figure 18:
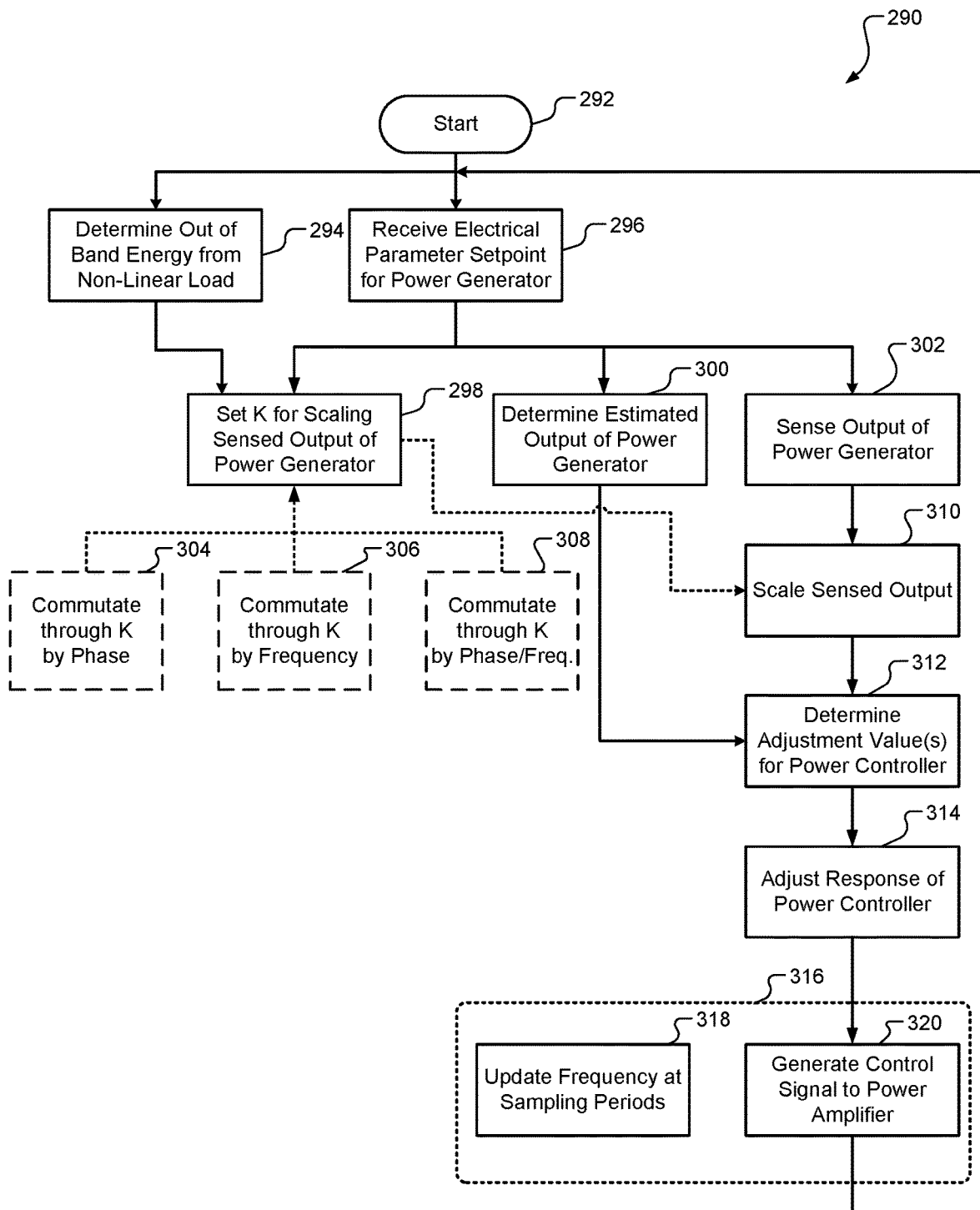
FIG. 18 is a flow chart for controlling a power controller according to various embodiments.

For further defined structure of power controller 84 of FIG. 4A, see the below provided method of FIG. 18 and the below provided definition for the term "module". The systems disclosed herein may be operated using numerous methods, an example control system method of which is illustrated in FIG. 18. Although the following operations are primarily described with respect to the implementations of FIG. 4A, the operations may be easily modified to apply to other implementations of the present disclosure. The operations may be iteratively performed. Although the following operations are shown and primarily described as being performed sequentially, one or more of the following operations may be performed while one or more of the other operations are being performed.

FIG. 18 depicts a flowchart 290 of power control system controlling the output of a power generator, such as power generator 74 of FIG. 4A or a power generator 75 of FIG. 4B. The method begins at 292 in which various initiation and startup processes are executed. Control proceeds either in parallel or sequentially to 294, which determines out-of-band energy from the non-linear load, and to 296, which receives an electrical parameter setpoint for the power generator. Control then proceeds either in parallel or sequentially to one of or all of 298, 300, 302. At 298, the out-of-band energy from the non-linear load and the setpoint are received, and the constant K for scaling a sensed output of the power generator is set. K can be set with input from any of 304, 306, or 308. At 304, the value K is commutated through phase. At 306, the K is commutated through frequency. At 308, K is commutated through both phase and frequency. The set value of K is thus commutated though a series of Ks at 298 for scaling the sensed output of the power generator. K is output to 310.

Returning to 300, 300 determines an estimated output of the power generator based upon the received electrical parameter setpoint. Block 300 outputs the estimated power generator output to 312. At 302, the output of the power generator is sensed, and control proceeds to 310. At 310 the output of the power generator is scaled in accordance with the constant K output by 298. Control then proceeds to 312 which determines an adjustment for the power controller in accordance with the scaled, sensed output and the estimated output of the power generator provided by 300. At 312, adjustment values are determined and output in order to adjust the response of a power controller at 314. Control then proceeds to 316. Block 316 updates the frequency at sampling periods at block 318 and generates a control signal to adjust the output of the power amplifier at block 320. Control then proceeds back to blocks 294, 296.

Note that in various embodiments, adaptive rate controller 100 may be implemented in a power generator 74, and reference model 98 and adaptive controller 96 may be omitted from the power generator 74. In such a configuration, power controller 84 generates a control signal to power amplifier 86 in accordance with power setpoint are and signal y. Similarly, in various embodiments, reference model 98 and adaptive controller 96 may be implemented in power generator 74, while adaptive rate controller 100 may be omitted from power generator 74. In such a configuration, scaling module 92 operates at a fixed value for K. Similar configuration variations are possible with respect to the power generator 75.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

In this application, apparatus elements described as having particular attributes or performing particular operations are specifically configured to have those particular attributes and perform those particular operations. Specifically, a description of an element to perform an action means that the element is configured to perform the action. The configuration of an element may include programming of the element, such as by encoding instructions on a non-transitory, tangible computer-readable medium associated with the element.

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

The invention claimed is:

1. A power generator, comprising:
an adaptive controller, the adaptive controller configured to generate a control signal based on an input setpoint for the power generator to generate a power signal, a measured representation of the power signal, and a modeled representation of the power signal, wherein the control signal includes a feedback component and a feedforward component; and
a power amplifier, the power amplifier configured to generate the power signal communicated to a non-linear load in accordance with the control signal.

2. The power generator of claim 1, wherein the adaptive controller comprises:
a feedforward circuit, the feedforward circuit configured to generate the feedforward component based on the input setpoint and a difference between the measured representation of the power signal and the modeled representation of the power signal; and
a feedback circuit, the feedback circuit configured to generate the feedback component based the difference between the measured representation of the power signal and the modeled representation of the power signal.

3. The power generator of claim 1, further comprising an adaptive rate controller, the adaptive rate controller configured to determine the measured representation of the power signal based on the input setpoint, the measured representation of the power signal, and the control signal.

4. The power generator of claim 1, further comprising an adaptive rate controller, the adaptive rate controller configured to generate an output to adaptively scale the measured representation of the power signal based on at least one of the input setpoint, the measured representation of the power signal, and the control signal, the adaptive controller further configured to generate the control signal based on the adaptively scaled measured representation of the power signal.

5. The power generator of claim 1, further comprising an adaptive rate controller, the adaptive rate controller configured to generate an output to adaptively scale the measured representation of the power signal based on commutating by at least one of phase, frequency, or both phase and frequency.

6. A system comprising the power generator of claim 1, and further comprising an adaptive rate controller, the adaptive rate controller comprising: a direct digital synthesizer, the direct digital synthesizer configured to generate a sinusoidal signal and a cosine signal based on a second control signal; a first mixer, the first mixer configured to mix the sinusoidal signal and a digital representation of the power signal, and to generate a real component of the digital representation of the power signal; a second mixer, the second mixer configured to mix the cosine signal and the digital representation of the power signal, and to generate an imaginary component of the digital representation of the power signal; and
  a subsystem controller, the subsystem controller configured to generate the second control signal based on the real and imaginary components, the input setpoint for the power generator, and a parameter used to control the power signal.

7. The system of claim 6, wherein the subsystem controller configured to generate an output to adaptively scale the measured representation of the power signal, and wherein the parameter that controls the power signal varies in accordance with the adaptively scaled measured representation of the power signal.

8. The system of claim 6, further comprising a scaling circuit, the scaling circuit configured to adaptively scale the measured representation of the power signal, wherein the parameter that is used to control the power signal varies in accordance with the adaptively scaled measured representation of the power signal.

9. The system of claim 6, wherein the subsystem controller configured to generate an output signal to adaptively scale the measured representation of the power signal, the system further comprising:
  a processor, the processor configured to process the digital representation of the power signal, and to generate a plurality of real and imaginary components; and
  a commutator, the commutator configured to selectively switch between the plurality of real and imaginary components based on the output signal to output a scaling factor to adaptively scale the measured representation of the power signal.

10. The system of claim 6, wherein the subsystem controller configured to generate an output signal to adaptively scale the measured representation of the power signal, the system further comprising:
  a processor, the processor configured to process the digital representation of the power signal, to generate a plurality of real and imaginary components, and to generate a composite value by combining a pair of the real and imaginary components and a complex value; and
  a commutator, the commutator configured to selectively switch between the composite value and the plurality of real and imaginary components based on the output signal to output a scaling factor to adaptively scale the measured representation of the power signal.

11. The power generator of claim 1, further comprising:
  a feedforward circuit, the feedforward circuit configured to generate a feedforward signal based on the input setpoint and based on a difference between the measured representation of the power signal and a modeled representation of the power signal;
  a feedback circuit, the feedback circuit configured to generate a feedback signal based on the difference between the measured representation of the power signal and the modeled representation of the power signal; and
  a combiner, the combiner configured to generate a second control signal by combining the feedforward signal and the feedback signal, wherein the second control signal enables the power generator to generate the power signal communicated to a non-linear load.

12. An adaptive controller, comprising:
  a feedforward circuit, the feedforward circuit configured to generate a feedforward signal based on an input setpoint for a power generator to generate a power signal and based on a difference between a measured representation of the power signal and a modeled representation of the power signal;
  a feedback circuit, the feedback circuit configured to generate a feedback signal based on the difference between the measured representation of the power signal and the modeled representation of the power signal; and
  a combiner, the combiner configured to generate a control signal by combining the feedforward signal and the feedback signal, wherein the control signal enables the power generator to generate the power signal communicated to a non-linear load.

13. A system comprising the adaptive controller of claim 12, and further comprising an adaptive rate controller, the adaptive rate controller configured to determine the measured representation of the power signal based on the input setpoint, the measured representation of the power signal, and the control signal.

14. The system of claim 13, further comprising a power amplifier, the power amplifier configured to generate the power signal in accordance with the control signal.

15. A system comprising the adaptive controller of claim 12, and further comprising an adaptive rate controller, the adaptive rate controller configured to generate an output to adaptively scale the measured representation of the power signal based on at least one of the input setpoint, the measured representation of the power signal, and the control signal, the adaptive controller further configured to generate the control signal based on the adaptively scaled measured representation of the power signal.

16. A system comprising the adaptive controller of claim 12, and further comprising an adaptive rate controller, the adaptive rate controller configured to generate an output to adaptively scale the measured representation of the power signal based on commutating by at least one of phase, frequency, or both phase and frequency.

17. A system comprising the adaptive controller of claim 12 and further comprising a power amplifier, the power amplifier configured to generate the power signal in accordance with the control signal.

18. A power generator, comprising:
  a power amplifier, the power amplifier configured to generate a power signal communicated to a non-linear load in accordance with an input control signal;
  a power controller, the power controller configured to communicate the input control signal to the power amplifier; and
  an adaptive controller, the adaptive controller configured to generate at least one adjustment value communicated to the power controller to adjust responsiveness of the power controller, wherein the at least one adjustment value includes one of a feedback component and a feedforward component, wherein the adaptive controller is further configured to generate the feedforward component and the feedback component based on a measured representation of the power signal and a modeled representation of the power signal.

19. The power generator of claim 18, wherein the power controller comprises:
  a first combiner, the first combiner configured to generate a first signal by combining an input setpoint for the power generator to generate the power signal and a measured representation of the power signal;
a first controller, the first controller configured to generate a second signal based on the first signal;
a mixer, the mixer configured to generate a third signal by mixing the second signal and the feedforward component; and
a second combiner, the second combiner configured to generate a control signal by combining the third signal and the feedback component, wherein the power generator generates the power signal in accordance with the control signal.

20. The power generator of claim 19, wherein the adaptive controller comprises:
a feedforward circuit, the feedforward circuit configured to generate the feedforward component based on a modeled representation of the power signal and based on a difference between the measured representation of the power signal and the modeled representation of the power signal; and
a feedback circuit, the feedback circuit configured to generate the feedback component based on the measured representation of the power signal and based on a difference between the measured representation of the power signal and the modeled representation of the power signal.

21. The power generator of claim 19, further comprising an adaptive rate controller, the adaptive rate controller configured to generate an output to adaptively scale the measured representation of the power signal based on at least one of the input setpoint, the measured representation of the power signal, and the control signal, the adaptive controller further configured to generate the control signal based on the adaptively scaled measured representation of the power signal.

22. The power generator of claim 19, further comprising an adaptive rate controller, the adaptive rate controller configured to generate an output to adaptively scale the measured representation of the power signal based on commutating by at least one of phase, frequency, or both phase and frequency.

23. A method, comprising:
generating a control signal based on an input setpoint for a power generator to generate a power signal, a measured representation of the power signal, and a modeled representation of the power signal, wherein the control signal includes a feedback component and a feedforward component; and
generating the power signal communicated to a non-linear load in accordance with the control signal.

24. The method of claim 23, further comprising:
generating the feedforward component based on the input setpoint and a difference between the measured representation of the power signal and the modeled representation of the power signal; and
generating the feedback component based on the difference between the measured representation of the power signal and the modeled representation of the power signal.

25. The method of claim 23, further comprising determining the measured representation of the power signal based on the input setpoint, the measured representation of the power signal, and the control signal.

26. The method of claim 23, further comprising:
generating an output to adaptively scale the measured representation of the power signal based on at least one of the input setpoint, the measured representation of the power signal, and the control signal; and
generating the control signal based on the adaptively scaled measured representation of the power signal.

27. The method of claim 23, further comprising generating an output to adaptively scale the measured representation of the power signal based on commutating by at least one of phase, frequency, or both phase and frequency.

* * * * *